US012767551B2

(12) United States Patent
Wu et al.

(10) Patent No.: US 12,767,551 B2
(45) Date of Patent: Oct. 20, 2026

(54) METHOD FOR REGULATING ELECTRON MOBILITY OF ZINC OXIDE

(71) Applicant: TCL TECHNOLOGY GROUP CORPORATION, Huizhou (CN)

(72) Inventors: Longjia Wu, Huizhou (CN); Tianshuo Zhang, Guangdong (CN); Junjie Li, Huizhou (CN); Yulin Guo, Huizhou (CN); Kai Tong, Huizhou (CN)

(73) Assignee: TCL TECHNOLOGY GROUP CORPORATION, Huizhou (CN)

(*) Notice: Subject to any disclaimer, the term of this patent is extended or adjusted under 35 U.S.C. 154(b) by 545 days.

(21) Appl. No.: 18/270,714

(22) PCT Filed: Dec. 29, 2021

(86) PCT No.: PCT/CN2021/142736
§ 371 (c)(1),
(2) Date: Jun. 30, 2023

(87) PCT Pub. No.: WO2022/143833
PCT Pub. Date: Jul. 7, 2022

(65) Prior Publication Data

US 2024/0010512 A1 Jan. 11, 2024

(30) Foreign Application Priority Data

Dec. 31, 2020 (CN) ......................... 202011640967.8

(51) Int. Cl.

| | |
|---|---|
| ***C01G 9/02*** | (2006.01) |
| ***H10K 50/115*** | (2023.01) |
| ***H10K 50/16*** | (2023.01) |
| ***H10K 102/00*** | (2023.01) |

(52) U.S. Cl.
CPC ............... *C01G 9/02* (2013.01); *H10K 50/16* (2023.02); *C01P 2002/85* (2013.01); *C01P 2006/60* (2013.01); *H10K 50/115* (2023.02)

(58) Field of Classification Search
CPC ......... C01G 9/02; H10K 50/16; H10K 50/115
See application file for complete search history.

(56) References Cited

U.S. PATENT DOCUMENTS

| | | | |
|---|---|---|---|
| 9,978,591 B2 | 5/2018 | Steiger et al. | |
| 2014/0227169 A1 | 8/2014 | Nishi et al. | |
| 2015/0076421 A1* | 3/2015 | Steiger ..................... | H01B 1/22 252/519.5 |

FOREIGN PATENT DOCUMENTS

| | | | | |
|---|---|---|---|---|
| CN | 103972395 A | | 8/2014 | |
| CN | 104064690 A | | 9/2014 | |
| CN | 104221133 A | | 12/2014 | |
| CN | 106634948 A | | 5/2017 | |
| CN | 108183173 A | | 6/2018 | |
| CN | 109509841 A | | 3/2019 | |
| CN | 111584731 A | * | 8/2020 | ............. H10K 71/12 |
| KR | 20130058523 A | | 6/2013 | |
| KR | 101878615 B1 | | 8/2018 | |
| WO | 2014148830 A1 | | 9/2014 | |
| WO | 2020134151 A1 | | 7/2020 | |

OTHER PUBLICATIONS

International Search Report dated Apr. 1, 2022; International Application No. PCT/CN2021/142736; 3 pages (English).
Written Opinion dated Apr. 1, 2022; International Application No. PCT/CN2021/142736; 5 pages (English).
Chen, Yichuan et al. "Investigation of the Doping Properties of ZnO:hHThin Filmprepared by RF Magnetron Sputtering" Journal of Functional Materials). vol. 44, No. 10, May 9, 2013 (May 9, 2013), ISSN: 1001-9731, pp. 1497-1500.
International Search Report dated Apr. 1, 2022; International Application No. PCT/CN2021/142736; 4 pages.
Written Opinion dated Apr. 1, 2022; International Application No. PCT/CN2021/142736; 4 pages.

* cited by examiner

*Primary Examiner* — Yong L Chu

(57) ABSTRACT

The present application discloses a method for regulating an electron mobility of a zinc oxide, and the method includes following step: preparing the zinc oxide, wherein the electron mobility of the zinc oxide is regulated by controlling a surface hydroxyl content of the zinc oxide during the preparation of the zinc oxide. In the method for regulating the electron mobility of the zinc oxide provided by the embodiment of the present application, carrier injection balance or improving electron mobility of quantum dot light-emitting diode devices can be achieved only by adjusting the surface hydroxyl content of the zinc oxide, without changing the device structure (inserting the electron barrier layer) or modifying the zinc oxide film by doping and other methods. The whole process is simple and low-cost, and has a good repeatability.

18 Claims, 9 Drawing Sheets

METHOD FOR REGULATING ELECTRON MOBILITY OF ZINC OXIDE

CROSS-REFERENCE TO RELATED APPLICATIONS

This application is the national phase entry of International Application No. PCT/CN2021/142736, filed on Dec. 29, 2021, which is based upon and claims priority to the Chinese Patent Application No. 202011640967.8, filed on Dec. 31, 2020, the entire contents each of which are incorporated herein by reference.

TECHNICAL FIELD

The present application relates to the field of display technology, and more particularly to a method for regulating an electron mobility of a zinc oxide.

BACKGROUND

The quantum dot (QD) is a class of nano-material composed of a small number of atoms, a radius of the quantum dot is usually less than or close to an exciton Bohr radius, which exhibits significant quantum limiting effects and has unique optical properties. Recently, with the continuous development of the display technology, Quantum Dot Light Emitting Diode (QLED) based on the quantum dot material as a light-emitting layer has attracted more and more attention. The QLED has the advantages of high luminous efficiency, controllable luminous color, high color purity, good device stability, and can be used for flexible applications, etc., which has a great application prospect in display technology, solid state lighting and other fields.

The QLED mainly includes a cathode, an anode, and a quantum dot luminescence layer. In order to improve the performance of the device, one or more layers of the hole transport injection layer, the hole transport layer, the electron transport layer and the electron injection layer are further introduced into the QLED as a functional layer. As a commonly used material of the electron transport layer in QLED, the zinc oxide has a good energy level matching relationship with the cathode and the quantum dot light-emitting layer, which significantly reduces the injection potential barrier of electrons from the cathode to the quantum dot light-emitting layer, and the deeper valence band energy level of the electron transport layer made of zinc oxide can effectively block holes. In addition, the zinc oxide material also has excellent electron transport capacity, with electron mobility up to $10^{-3}$ $cm^2/V•S$. These characteristics make the zinc oxide material the preferred material for the electron transport layer in quantum dot light-emitting diode devices, which significantly improves the stability and luminous efficiency of the devices.

Since the QLED display technology and the Organic Light-Emitting Diode (OLED) display technology have similarities in the light-emitting principle, therefore, the interpretation of device physics in QLED devices, the selection and collocation principle of functional layer material energy level, etc. are all follow the existing theoretical system in OLED. For example, in order to obtain higher device performance in OLED devices, it is necessary to fine-tune the carrier injection of holes and electrons on both sides of the device to achieve the carrier injection balance in the light-emitting layer of the device. When applying the above classical physical conclusions of OLED devices to the QLED device system, considering that the electron mobility of the zinc oxide layer is often higher than that of the hole transport layer, in order to achieve a better carrier injection balance in the QLED devices, it is necessary to reduce the electron mobility of the zinc oxide layer by inserting an electron barrier layer between the light-emitting layer and the zinc oxide layer. When the above methods are applied to the QLED devices, the performance of the QLED devices is indeed significantly improved, especially the efficiency of the QLED devices. The external quantum efficiency of the QLED devices is more than 20% by the method, which is close to the upper limit of theoretical values.

However, there are some limitations in improving carrier injection balance and device lifetime by method of changing device structure by inserting electron barrier layer, etc. On the one hand, it is difficult to change the device structure by inserting an electronic barrier layer in the actual device preparation, which has strict thickness requirements for the electronic barrier layer, and it is difficult to play an effective role when the electron barrier layer is too thick or too thin, and even reduce the performance of QLED device, so that the actual operation is difficult to be controlled. In addition, the method of changing the device structure (adding an electronic barrier layer) will also increase the cost of device preparation, and the cost burden in the mass production of QLED devices is increased in the future. On the other hand, in the process of using the above strategy to try to improve and enhance another key performance (device lifetime) of QLED devices, there are also problems: So far, the classical ideas and strategies formed in OLED are not easy to effectively improve the lifetime of QLED devices, and although high QLED device efficiency has been obtained through classical ideas and strategies, it is often found that the device life of these efficient QLED devices is significantly worse than that of similar devices with lower efficiency. Therefore, it is necessary to find a more effective and cost-effective way to adjust the electron mobility of the zinc oxide layer to improve the external quantum efficiency and/or device lifetime of the quantum dot light-emitting diode.

SUMMARY

One of objects of embodiment of the present application is to provide a quantum dot light-emitting diode and a method for preparing the same.

The technical solution adopted in an embodiment of the present application is that:

A method for regulating an electron mobility of a zinc oxide is provided, and the method includes following steps:

preparing the zinc oxide, wherein the electron mobility of the zinc oxide is regulated by controlling a surface hydroxyl content of the zinc oxide during the preparation of the zinc oxide.

In some embodiments, the surface hydroxyl content of the zinc oxide is controlled to be greater than or equal to 0.6 during the preparation of the zinc oxide.

In some embodiments, the zinc oxide is zinc oxide nano-particles and a method of controlling the surface hydroxyl content of the zinc oxide includes:

collecting a precipitate after mixing a zinc salt solution with a first lye; and performing a cleaning treatment twice or less to the precipitate using a reaction solvent, to obtain the zinc oxide nano-particles with the surface hydroxyl content greater than or equal to 0.6.

In some embodiments, an alkali of the first lye is selected from an alkali having $K_b>10^{-1}$, and a number of the cleaning treatment is less than or equal to 2 times.

In some embodiments, an alkali of the first lye is selected from an alkali having $K_b<10^{-1}$, and a number of the cleaning treatment is less than or equal to one time.

In some embodiments, the zinc oxide is zinc oxide nano-particles and a method of controlling the surface hydroxyl content of the zinc oxide includes:

collecting a precipitate after mixing a zinc salt solution with a first lye; dissolving the precipitate after being cleaning treatment to obtain a zinc oxide colloidal solution; and adding a second lye to the zinc oxide colloidal solution, adjusting a pH value of the zinc oxide colloidal solution to be greater than or equal to 8, and preparing the zinc oxide nano-particles with the surface hydroxyl content greater than or equal to 0.6.

In some embodiments, in the step of adding the second lye to the zinc oxide colloidal solution and adjusting the pH value of the zinc oxide colloidal solution to be greater than or equal to 8, adding the second lye to the zinc oxide colloidal solution to obtain a mixed solution with the pH between 9 and 12.

In some embodiments, each of the first lye and the second lye is independently a lye formed by at least one independently selected from a group of a potassium hydroxide, a sodium hydroxide, a lithium hydroxide, a tetramethylammonium hydroxide (TMAH), an ammonia, an ethanolamine, and an ethylenediamine.

In some embodiments, the zinc oxide is a zinc oxide film, and a method of controlling the surface hydroxyl content of the zinc oxide includes:

preparing a zinc oxide prefabricated film on a substrate; and performing a drying treatment after depositing a second lye on a surface of the zinc oxide prefabricated film, to obtain the zinc oxide film with the surface hydroxyl content greater than or equal to 0.6.

In some embodiments, a concentration of the second lye is ranged from 0.05 mmol/L to 5 mmol/L.

In some embodiments, an alkali of the second lye is an inorganic alkali, and the concentration of the second lye is ranged from 0.05 mmol/L to 0.1 mmol/L.

In some embodiments, in the step of after depositing the second lye on the surface of the zinc oxide prefabricated film, an addition amount of the second lye is satisfied as follows: every 5 mg zinc oxide prefabricated film is treated with the second lye of 50 μL-400 μL In some embodiments, an alkali of the second lye is an inorganic alkali, and the concentration of the second lye is ranged from 0.2 mmol/L to 0.4 mmol/L.

In some embodiments, in the step of after depositing the second lye on the surface of the zinc oxide prefabricated film, an addition amount of the second lye is satisfied as follows: every 5 mg zinc oxide prefabricated film is treated with the second lye of 50 μL-1000 μL.

In some embodiments, a temperature of the drying treatment is ranged from 10° C. to 100° C. and a drying duration is ranged from 10 minutes to 2 hours In some embodiments, the surface hydroxyl content of the zinc oxide is controlled to be less than or equal to 0.4 during the preparation of the zinc oxide.

In some embodiments, the zinc oxide is zinc oxide nano-particles and a method of controlling the surface hydroxyl content of the zinc oxide includes:

collecting a precipitate after mixing a zinc salt solution with a first lye; and performing a cleaning treatment twice or more to the precipitate using a reaction solvent, to obtain the zinc oxide nano-particles with the surface hydroxyl content less than or equal to 0.4.

In some embodiments, an alkali of the first lye is selected from an alkali having $K_b>10^{-1}$, and a number of the cleaning treatment is greater than or equal to 3 times.

In some embodiments, an alkali of the first lye is selected from an alkali having $K_b<10^{-1}$, and a number of the cleaning treatment is greater than or equal to 2 times.

In some embodiments, the zinc oxide is zinc oxide nano-particles and a method of controlling the surface hydroxyl content of the zinc oxide includes:

collecting a precipitate after mixing a zinc salt solution with a first lye; dissolving the precipitate after being cleaning treatment to obtain a zinc oxide colloidal solution; and adding an acid solution to the zinc oxide colloidal solution, adjusting a pH value of the zinc oxide colloidal solution to be ranged from 7 to 8, and preparing the zinc oxide nano-particles with the surface hydroxyl content less than or equal to 0.4.

In some embodiments, in the step of adding the acid solution to the zinc oxide colloidal solution and adjusting the pH value of the zinc oxide colloidal solution to be ranged from 7 to 8, adding the acid solution to the zinc oxide colloidal solution, to obtain a mixed solution with the pH value between 7.2 to 7.8.

In some embodiments, an acid in the acid solution is at least one selected from a group of a hydrochloric acid, a sulfuric acid, a nitric acid, a hydrofluoric acid, a formic acid, an acetic acid, a propionic acid, an oxalic acid, and a propylene.

In some embodiments, the zinc oxide is a zinc oxide film, and a method of controlling the surface hydroxyl content of the zinc oxide includes:

preparing a zinc oxide prefabricated film on a substrate; and performing a drying treatment after depositing an acid solution on a surface of the zinc oxide prefabricated film, to obtain the zinc oxide film with the surface hydroxyl content less than or equal to 0.4.

In some embodiments, a concentration of the acid solution is ranged from 0.05 mmol/L to 0.5 mmol/L.

In some embodiments, in the step of after depositing the acid solution on the surface of the zinc oxide prefabricated film, an addition amount of the acid solution is satisfied as follows: every zinc oxide prefabricated film is treated with the acid solution of 50 μL-1000 μL.

In some embodiments, an acid in the acid solution is an inorganic acid, and the concentration of the acid solution is ranged from 0.05 mmol/L to 0.1 mmol/L.

In some embodiments, in the step of after depositing the acid solution on the surface of the zinc oxide prefabricated film, an addition amount of the acid solution is satisfied as follows: every zinc oxide prefabricated film is treated with the acid solution of 50 μL-200 μL.

In some embodiments, an acid in the acid solution is an organic carboxylic acid, and the concentration of the acid solution is ranged from 0.2 mmol/L to 0.4 mmol/L.

In some embodiments, in the step of after depositing the acid solution on the surface of the zinc oxide prefabricated film, an addition amount of the acid solution is satisfied as follows: every 5 mg zinc oxide prefabricated film is treated with the acid solution of 100 μL-500 μL.

In some embodiments, a temperature of the drying treatment is ranged from 10° C. to 100° C. and a drying duration is ranged from 10 minutes to 2 hours.

In some embodiments, the zinc oxide is doped zinc oxide nano-particles or undoped zinc oxide nano-particles, and doped ions of the doped zinc oxide nano-particles are at least one selected from a group of $Mg^{2+}$, $Mn^{2+}$, $Al^{3+}$, $Y^{3+}$, $La^{3+}$, $Li^{+}$, $Gd^{3+}$, $Zr^{4+}$, and $Ce^{4+}$.

The beneficial effects of the method for regulating the electron mobility of the zinc oxide provided by the embodiment of the present application are: Carrier injection balance or improving electron mobility of quantum dot light-emitting diode devices can be achieved only by adjusting the surface hydroxyl content of the zinc oxide, without changing the device structure (inserting the electron barrier layer) or modifying the zinc oxide film by doping other electron transport materials other than zinc oxide. The whole process is simple and low-cost, and has a good repeatability.

DETAILED DESCRIPTION OF EMBODIMENTS

Figure 1:
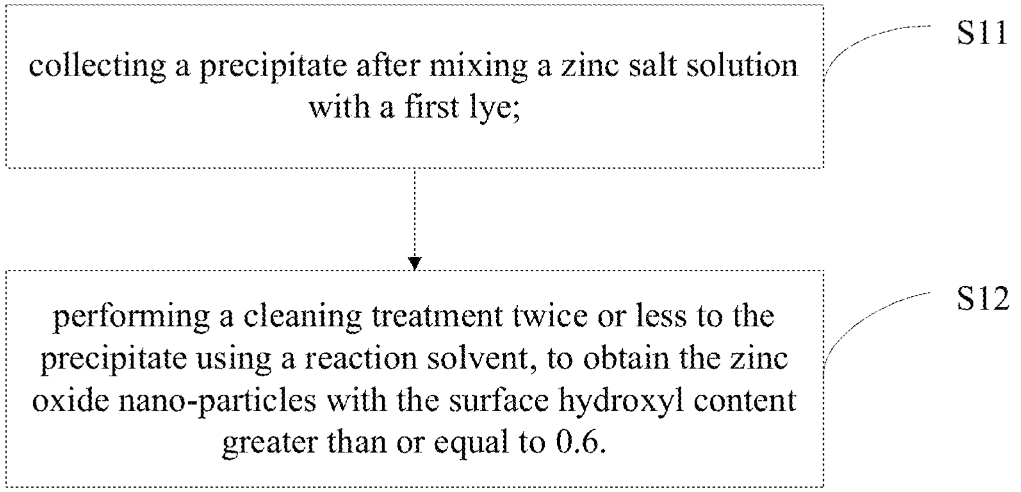
FIG. 1 is the flowchart of a first method for controlling a surface hydroxyl content of a zinc oxide greater than or equal to 0.6 provided by an embodiment of the present application.

In order to make the purpose, the technical solution and the advantages of the present application be clearer and more understandable, the present application will be further described in detail below with reference to accompanying figures and embodiments. It should be understood that the specific embodiments described herein are merely intended to illustrate but not to limit the present application.

In the description of the present application, it needs to be understood that terms "the first" and "the second" are only used in describe purposes, and should not be considered as indicating or implying any relative importance, or impliedly indicating the number of indicated technical features. As such, technical feature(s) restricted by "the first" or "the second" can explicitly or impliedly comprise one or more such technical feature(s). In the description of the present application, "a plurality of" means two or more, unless there is additional explicit and specific limitation.

The weight of the relevant components mentioned in the embodiment specification of the present application can refer not only to the specific content of each component, but also to the proportional relationship between the weights of each component. Therefore, as long as the content of the relevant components is scaled up or reduced in accordance with the embodiment specification of the present application, it is within the scope disclosed in the embodiment specification of the present application. In particular, the weight stated in the specification of embodiments of the present application may be μg, mg, g, kg, and other units of mass known in the field of chemical industry.

Due to the poor implementation of methods to improve the external quantum efficiency and/or device lifetime of the quantum dot light-emitting diode, the improvement effect on the external quantum efficiency and/or device lifetime of the quantum dot light-emitting diode is not obvious. In view of this, the present application embodiment provides a method for regulating an electron mobility of a zinc oxide.

The method for regulating the electron mobility of the zinc oxide includes the following step:

preparing the zinc oxide, and the electron mobility of the zinc oxide is regulated by controlling a surface hydroxyl content of the zinc oxide during the preparation of the zinc oxide.

In the method for regulating the electron mobility of the zinc oxide provided by an embodiment of the present application, carrier injection balance or improving electron mobility of quantum dot light-emitting diode devices can be achieved only by adjusting the surface hydroxyl content of the zinc oxide, without changing the device structure (inserting the electron barrier layer) or modifying the zinc oxide film by doping other electron transport materials other than zinc oxide. The whole process is simple and low-cost, and has a good repeatability.

In the process of experimental research, the inventor found that in the zinc oxide colloidal solution, due to the characteristics of the zinc oxide colloidal itself, the surface of the zinc oxide colloidal adsorbs a large number of ionized hydroxyl groups. These hydroxyl groups are negatively charged and adsorbed on the surface of the zinc oxide nano-particles in large quantities, making the surface of the zinc oxide nano-particles also negatively charged. Under the action of electrostatic coulomb repulsion between the zinc oxide nano-particles, the zinc oxide nano-particles can be dispersed in polar solution, and have good solution stability and dispersion. When the zinc oxide colloidal solution is deposited into a zinc oxide film, a large number of hydroxyl groups will still cover the surface of the zinc oxide particles after curing the film. When the zinc oxide film is used as the electron transport layer in the quantum dot light-emitting diode, due to the adsorption of a large number of negatively charged hydroxyl groups on the surface of the zinc oxide, the transmission of electrons in the zinc oxide layer will play a certain inhibition and obstruction role, so the surface hydroxyl content of the zinc oxide film will directly affect the injection of electrons in the quantum dot light-emitting diode device. When the surface hydroxyl content of the zinc oxide is more, the transmission of electrons in the quantum dot light-emitting diode device will be inhibited, and the injected electrons in the quantum dot light-emitting layer will be reduced. When the surface hydroxyl content of the zinc oxide is small, the transmission of electrons in the quantum dot light-emitting diode device will be smooth, and the injection of electrons in the quantum dot light-emitting layer will be increased.

It should be understood that in embodiments of the present application, the zinc oxide can be either undoped zinc oxide nano-particles, i.e., pure zinc oxide, or doped zinc oxide nano-particles. In some embodiments, the doped ions in the doped zinc oxide nano-particles are selected from at least one of Mg2+ and Mn2+. In this case, doped metal ions and zinc ions have the same valence state, but their oxides have metal ions with different conduction band levels. In this case, doping such metal ions can adjust the conduction band levels of zinc oxide electron transport layer, so as to optimize the energy level matching between the quantum dot light-emitting layer and the electron transport layer in the quantum dot light-emitting diode device, and improve the EQE of the device. In some embodiments, the doped ions of the doped zinc oxide nano-particles are at least one selected from a group of $Mg^{2+}$, $Mn^{2+}$, $Al^{3+}$, $Y^{3+}$, $La^{3+}$, $Li^{+}$, $Gd^{3+}$, $Zr^{4+}$, and $Ce^{4+}$. In this case, doped metal ions and zinc ions have different valence states of metal ions, by doping the metal ion can adjust the oxygen vacancy (electron mobility) of the zinc oxide electron transport layer, so as to optimize the carrier injection balance of quantum dot light-emitting diode devices and improve the EQE of the device.

In the first embodiment, the surface hydroxyl content of the zinc oxide is controlled to be greater than or equal to 0.6 during the preparation of the zinc oxide. The zinc oxide with the surface hydroxyl content greater than or equal to 0.6 is used as the electron transport layer material to inhibit the transmission of electrons in the electron transport layer and reduce the transmission of electrons in the quantum dot light-emitting diode, therefore, the injection of electrons in the quantum dot light-emitting layer is reduced, so as to achieve the carrier injection balance in the quantum dot light-emitting diode. Finally, a higher external quantum efficiency is given in the initial operating state of the device.

In the process of preparing the zinc oxide, controlling the surface hydroxyl content of the zinc oxide being greater than or equal to 0.6, which can be achieved in several ways.

In the first possible embodiment, as shown in FIG. 1, the zinc oxide is zinc oxide nano-particles, and the method for controlling the surface hydroxyl content of the zinc oxide includes:

- S11; collecting a precipitate after mixing a zinc salt solution with a first lye; and
- S12; performing a cleaning treatment twice or less to the precipitate using a reaction solvent, to obtain the zinc oxide nano-particles with the surface hydroxyl content greater than or equal to 0.6.

The embodiment uses the solution method to prepare a zinc oxide colloidal solution as a film forming solution for a zinc oxide film with a surface hydroxyl content greater than or equal to 0.6. In the preparation process of the zinc oxide colloidal solution prepared by solution method, the cleaning treatment is performed twice or less to the precipitate obtained using a reaction solvent, to obtain the zinc oxide nano-particles with the surface hydroxyl content greater than or equal to 0.6. By using the zinc oxide film with the surface hydroxyl content greater than or equal to 0.6 as the electron transport layer, the transmission of electrons to the quantum dot light-emitting layer is inhibited, and the electrons injected into the quantum dot light-emitting layer are reduced, which makes the electrons and holes in the quantum dot light-emitting diode more balanced, thus improving the external quantum efficiency of the device.

The basic process of preparing the zinc oxide nano-particles in the embodiment of the present application is that: mixing a zinc salt solution with a first lye, reacting to produce hydroxide intermediates such as zinc hydroxide; the zinc oxide nano-particles are gradually formed by polycondensation of the hydroxide intermediates.

Specifically, in the above step S11, the zinc salt solution is a salt solution formed by a zinc salt dissolved in a solvent. The zinc salt selects a salt that can react with the first lye to produce a zinc hydroxide, which includes but not limited to one selected from a group of a zinc acetate, a zinc nitrate, a zinc sulfate, and a zinc chloride. The solvent with good solubility to zinc salt and zinc oxide nano-particles is selected, which includes but not limited to one selected from a group of water, an organic alcohol, an organic ether, a sulfone and other solvents with greater polarity. In some embodiments, the solvent is at least one selected from a group of water, an organic alcohol, an organic ether, and a sulfone. This kind of solvent not only has a good solubility to the zinc salt, as a reaction medium in alkaline environment is relatively stable, and is not easy to introduce side reactions; moreover, it is soluble to the polar end product zinc oxide nano-particles. In addition, the solvent can ionize the reaction alkali and can be used at the same time as the dissolved solvent of zinc salt and the dilution or dissolution solvent of the reaction alkali to promote the reaction between the alkali and the zinc salt. As an example, the solvent may be at least one selected from a group of water, a methanol, an ethanol, a propanol, a butanol, an ethylene glycol, an ethylene glycol monomethyl ether, and a dimethyl sulfoxide (DMSO).

In the embodiment of the present application, the first lye is a solution formed by an alkali capable of reacting with zinc salts to produce zinc hydroxide, and in particular, the first lye provides hydroxide ions that react with zinc ions in the reaction system. It should be understood that when the zinc salt contains doped metal ions, the first lye provides hydroxide ions reacting with both the zinc ions and the doped metal ions. In embodiments of the present application, the first lye is obtained by dissolving or diluting the alkali in a solvent. On the one hand, solid alkalies such as sodium hydroxide can be dissolved by solvents to form a liquid first lye, and then the liquid first lye is added to the reaction system, which is conducive to the dispersion and uniformity of the first lye in the reaction system; on the other hand, the concentration of the alkali in the first lye can be adjusted through dissolution or dilution such that the concentration of the alkali within 0.1 mol/L to 2 mol/L, so as to avoid adding too much alkali concentration, resulting in too fast reaction rate, and eventually resulting in uneven size of zinc oxide nano-particles, and when zinc oxide particles are too large, agglomeration also occurs.

The alkali in the first lye can select an inorganic alkali or an organic base; which can select a strong alkali or a weak base. In one possible embodiment, the alkali in the first lye is selected from an alkali having $K_b>10^{-1}$, and exemplary, the alkali having $K_b>10^{-1}$ is at least one selected from a group of a potassium hydroxide, a sodium hydroxide, and a lithium hydroxide. In one possible embodiment, the alkali in the first lye is selected from an alkali having $K_b<10^{-1}$, and exemplary, the alkali having $K_b<10^{-1}$ is at least one selected from a group of a tetramethylammonium hydroxide (TMAH), an ammonia, an ethanolamine, and an ethylenediamine. A solvent for dissolving or diluting an alkali to form the first lye, capable of dissolving or miscible with the alkali, in addition, the solvent has the same polarity as that of the zinc oxide nano-particles. In some embodiments, the solvent used to dissolve or dilute the alkali to form the first lye may be the same or different from the solvent in the zinc salt solution. In some embodiments, the solvent used to dissolve or dilute the alkali to form the first lye is selected to be the same from the solvent in the zinc salt solution, which is more conducive to obtaining a stable reaction system. The same solvent includes but is not limited to water, an organic alcohol, an organic ether, a sulfone and other solvents with greater polarity. In some embodiments, the solvent is at least one selected from a group of water, an organic alcohol, an organic ether, and a sulfone. As an example, the solvent is at least one selected from a group of water, a methanol, an ethanol, a propanol, butanol, an ethylene glycol, an ethylene glycol monomethyl ether, and a dimethyl sulfoxide (DMSO).

In some embodiments, the zinc salt solution is mixed with the first lye at a temperature of 0-70° C., and the reaction duration is 30 min-4 h to prepare zinc oxide nano-particles. In some embodiments, the mixing of the zinc salt solution and the first lye is processed by dissolving the zinc salt at room temperature (5° C.-40° C.) to obtain the zinc salt solution, and dissolving or diluting the alkali at room temperature to obtain the first lye; the temperature of the zinc salt solution is adjusted to 0-70° C., and the first lye is then added. In this case, the added alkali reacts with the zinc salt in the zinc salt solution to form zinc oxide nano-particles, and good particle dispersion can be obtained. When the reaction temperature is lower than 0° C., the formation of the zinc oxide nano-particles will be significantly slowed down, and the reaction can be achieved with the help of special equipment, which increases the difficulty of the reaction. Even under some conditions, it is not easy to produce the zinc oxide nano-particles, but only hydroxide intermediates can be obtained. However, when the reaction temperature is higher than 70° C., the reactivity is too high, the produced zinc oxide nano-particles are seriously agglomerated, and it is difficult to get a colloidal solution have a good dispersion, which affects the late film formation of the zinc oxide colloidal solution. In some embodiment, the reaction temperature between the zinc salt solution and the first lye is room temperature (about 50° C.), in this case, it is not only conducive to the formation of the zinc oxide nano-particles, but also the obtained zinc oxide ions have a good particle dispersion, which is conducive to the film formation of the zinc oxide colloidal solution. In some embodiments, a qualified zinc oxide colloidal solution can be easily produced by mixing the zinc salt solution with the first lye at a temperature of 0-30° C. In some embodiments, a zinc oxide colloidal solution can also be produced at a temperature of 30° C.-70° C., and the quality of the obtained zinc oxide colloidal solution is not as good as the zinc oxide colloidal solution produced at 0-30° C., and the reaction time is also reduced.

In some embodiments, in the steps of mixing the zinc salt solution with the first lye, the zinc salt solution is mixed with the first lye according to a molar ratio of hydroxide ions to zinc ions is 1.5:1 to 2.5:1 to ensure the formation of zinc oxide nano-particles and reduce the generation of reaction byproducts. When the molar ratio of the hydroxide ions to the zinc ions is less than 1.5:1, the zinc salt is significantly excessive, which makes it difficult for a large number of zinc salts to produce zinc oxide nano-particles. When the molar ratio of the hydroxide ions to the zinc ions is greater than 2.5:1, the first lye is significantly excessive, and the excessive hydroxide ions form a stable complex with zinc hydroxide intermediate, which is not easy to polycondensation to form the zinc oxide nano-particles. In some embodiments, in the steps of mixing the zinc salt solution with the first lye, the addition amount of the zinc salt solution with the first lye meets the requirement that the ratio of the molar amount of hydroxide ions provided by the first lye to the molar amount of zinc ions provided by the zinc salt is 1.7:1 to 1.9:1.

In some embodiments, after the zinc salt solution is mixed with the first lye, and the reaction temperature is 0-70° C. and the reaction duration is carried out for 30 min-4 h to ensure the formation of the zinc oxide nano-particles, and the particle size of the nano-particles is controlled. When the reaction duration is less than 30 min, zinc oxide cluster seeds are obtained with too low reaction duration. In this case, the crystal state of the sample is incomplete and the crystal structure is poor. If the sample is used as the electron transport layer material, the conductivity of the electron transport layer will be poor. However, when the reaction duration is more than 4 h, the long particle growth time will cause the produced nano-particles to be too large and the particle size is not uniform, and the surface roughness of the zinc oxide colloidal solution will be higher after film formation, which will affect the electron transport performance. In some embodiments, the zinc salt solution is mixed with the first lye and reacts at the reaction temperature for 1-2 h.

In some embodiments, the zinc salt solution is mixed with the first lye at a temperature of 0-70° C., and the reaction duration is carried out for 30 min-4 h under the condition of agitation to promote the uniformity of the reaction and the particle uniformity of the obtained zinc oxide nano-particles, and the zinc oxide nano-particles with uniform size are obtained.

In the embodiment of the present application, after the reaction is completed, a precipitating agent is added to the mixed solution after the reaction is completed, and the precipitate is collected. The precipitating agent selects a solvent with the opposite polarity to the end product zinc oxide nano-particles, thereby reducing the solubility of the zinc oxide nano-particles and precipitating them. In some embodiments, the precipitating agent selects a solvent with weak polarity, which is opposite to the polarity of the zinc oxide nano-particles and is conducive to the precipitation of zinc oxide nano-particles. As an example, the precipitating agent includes but is not limited to an ethyl acetate, an acetone, a n-hexane, a n-heptane, and other low-polarity long-chain alkanes.

In some embodiments, two to six times the volume of the precipitating agent (i.e., the volume ratio of the precipitating agent to the mixed solution is 2:1 to 6:1) is added to the mixed solution after the reaction is completed, resulting in a white precipitate in the mixed solution. In this case, it is ensured that under the premise of sufficient precipitating of the zinc oxide nano-particles, the solubility of the zinc oxide particles will not be damaged due to excessive precipitating agent. In some embodiments, the volume ratio of the precipitating agent to the mixed solution is 3:1 to 5:1.

In the embodiment of the present application, the precipitation-treated mixed system is centrifuged to collect the precipitate. The embodiment of the present application uses a reaction solvent to clean the collected precipitate to remove reactants that are not involved in the reaction. In order to improve the purity of the zinc oxide nano-particles, the excess zinc salt, the alkali, and other raw materials are removed by cleaning the obtained zinc oxide nano-particles using the reaction solvent. It should be noted that the reaction solvent is mentioned as above. In some embodiments, the reaction solvent is at least one selected from a group of water, an organic alcohol, an organic ether, a sulfone. As an example, the solvent is at least one selected from a group of water, a methanol, an ethanol, a propanol, a butanol, an ethylene glycol, an ethylene glycol monomethyl ether, and a dimethyl sulfoxide (DMSO).

Since the zinc oxide nano-particles are formed by the reaction of the zinc salt and the alkali in the embodiment of the present application, in the polar zinc oxide solution, due to the characteristics of the zinc oxide colloidal itself, the surface of the zinc oxide colloidal adsorbs a large number of ionized hydroxyl groups. These hydroxyl groups are negatively charged and adsorbed on the surface of the zinc oxide nano-particles in large quantities, making the surface of the zinc oxide nano-particles also negatively charged. Under the action of electrostatic coulomb repulsion between the zinc oxide nano-particles, the zinc oxide nano-particles can be dispersed in polar solution, and have good solution stability and dispersion. When the zinc oxide colloidal solution is deposited into a zinc oxide film, a large number of hydroxyl groups will still cover the surface of the zinc oxide particles after curing the film. When the zinc oxide film is used as the electron transport layer in the quantum dot light-emitting diode, due to the adsorption of a large number of negatively charged hydroxyl groups on the surface of the zinc oxide, the transmission of electrons in the zinc oxide layer will play a certain inhibition and obstruction role, so the surface hydroxyl content of the zinc oxide film will directly affect the injection of electrons in the quantum dot light-emitting diode device. When the surface hydroxyl content of the zinc oxide is more, the transmission of electrons in the quantum dot light-emitting diode device will be inhibited, and the injected electrons in the quantum dot light-emitting layer will be reduced. When the surface hydroxyl content of the zinc oxide is small, the transmission of electrons in the quantum dot light-emitting diode device will be smooth, and the injection of electrons in the quantum dot light-emitting layer will be increased. Therefore, in the above step S12, the embodiment of the present application adjusts the surface hydroxyl content of the obtained zinc oxide nano-particles by controlling the number of cleaning times.

Specifically, when the cleaning times to the zinc oxide nano-particles are more, the residual hydroxyl content on the surface is correspondingly less; when the cleaning times of the zinc oxide nano-particles are more, the residual hydroxyl content on the surface is correspondingly less. The embodiment of the present application uses a reaction solvent to perform cleaning treatment twice or less to the precipitate, so that the surface hydroxyl content of the zinc oxide nano-particles is greater than or equal to 0.6.

In one possible embodiment, if the alkali in the first lye is an alkali having $K_b>10^{-1}$, and the number of cleaning treatments is less than or equal to 2. In this case, due to the large ionization coefficient of the alkali having $K_b>10^{-1}$, so that the surface hydroxyl content of the final synthesized zinc oxide colloidal is more, the final synthesized zinc oxide colloidal surface contains more hydroxyl, and the state of high surface hydroxyl content of the zinc oxide can be maintained after the cleaning times are less than or equal to 2 times.

In one possible embodiment, if the alkali in the first lye is an alkali having $K_b<10^{-1}$, and the number of cleaning treatments is less than or equal to 1. When the reaction alkali is an alkali having $K_b<10^{-1}$, due to the small ionization coefficient of the alkali, the surface hydroxyl content of the final synthesized zinc oxide colloidal is less, so the cleaning times are less than or equal to 1 times to achieve more surface hydroxyl content.

The selection of the alkali of different $K_b$ can refer to the above. For example, the alkali having $K_b>10^{-1}$ includes but is not limited to strong inorganic alkalies such as a potassium hydroxide, a sodium hydroxide, and a lithium hydroxide; and the alkali having $K_b<10^{-1}$ includes but is not limited to a tetramethylammonium hydroxide (TMAH), an ammonia, an ethanolamine, an ethylenediamine, and other organic weak alkalies.

In some embodiments, the alkali in the first lye is at least one selected from a group of a potassium hydroxide, a sodium hydroxide, and a lithium hydroxide, the number of cleaning times to the collected precipitate using the reaction solvent is 1, and zinc oxide nano-particles with a surface hydroxyl content greater than or equal to 0.6 can be obtained. In some embodiments, the alkali in the first lye is at least one selected from a group of a tetramethylammonium hydroxide (TMAH), an ammonia, an ethanolamine, and an ethylenediamine, the number of cleaning times to the collected precipitate using the reaction solvent is 1, and zinc oxide nano-particles with a surface hydroxyl content greater than or equal to 0.6 can be obtained.

Figure 2:
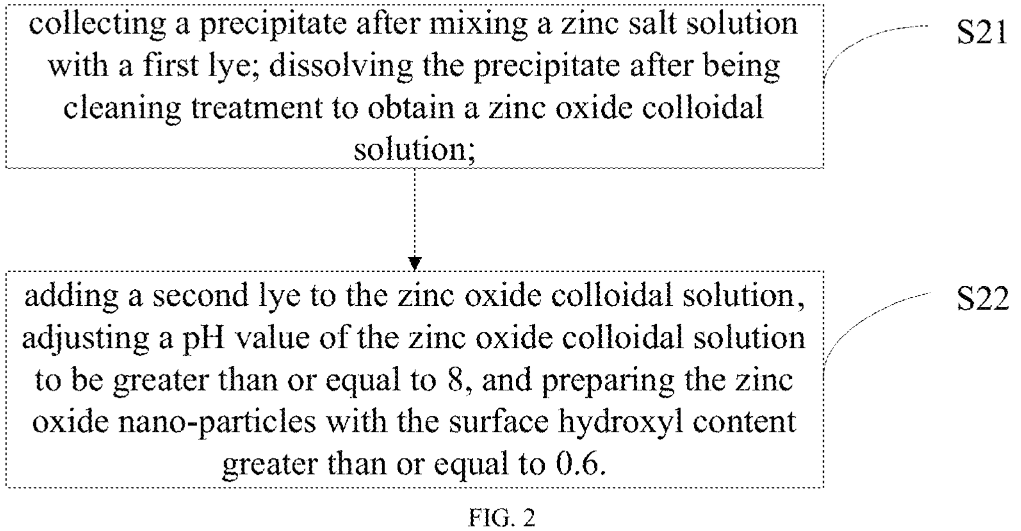
FIG. 2 is the flowchart of a second method for controlling a surface hydroxyl content of a zinc oxide greater than or equal to 0.6 provided by an embodiment of the present application.

In the second possible embodiment, as shown in FIG. 2, the zinc oxide is zinc oxide nano-particles and a method of controlling the surface hydroxyl content of the zinc oxide includes:

S21; collecting a precipitate after mixing a zinc salt solution with a first lye; dissolving the precipitate after being cleaning treatment to obtain a zinc oxide colloidal solution;

S22; adding a second lye to the zinc oxide colloidal solution, adjusting a pH value of the zinc oxide colloidal solution to be greater than or equal to 8, and preparing the zinc oxide nano-particles with the surface hydroxyl content greater than or equal to 0.6.

The embodiment first uses the solution method to prepare the zinc oxide colloidal solution, the second lye is then added to the zinc oxide colloidal solution, the pH value of the zinc oxide colloidal solution is adjusted to be greater than or equal to 8, and the zinc oxide solution is obtained, so as to obtain the zinc oxide with a surface hydroxyl content greater than or equal to 0.6. By using the zinc oxide film with the surface hydroxyl content greater than or equal to 0.6 as the electron transport layer, the transmission of electrons to the quantum dot light-emitting layer is inhibited, and the electrons injected into the quantum dot light-emitting layer are reduced, which makes the hole electron injection in the quantum dot light-emitting diode more balanced, and finally improves the device lifetime.

The basic process of preparing the zinc oxide in the embodiment is that: mixing a zinc salt solution with a first lye, reacting to produce hydroxide intermediates such as zinc hydroxide; the zinc oxide nano-particles are gradually formed by polycondensation of the hydroxide intermediates.

In the above step S21, the selection basis and type of zinc salt solution, zinc salt and solvent in zinc salt solution, and the formation method of zinc salt solution, the selection basis and type of the first lye, the alkali and solvent in the first lye, and the formation method of the first lye are the same as the first embodiment mentioned above, and the addition ratio of the zinc salt and the alkali in the first lye, etc., are the same as the first embodiment mentioned above in step S11.

In some embodiments, the zinc salt solution is mixed with the first lye at a temperature of 0-70° C., and the reaction duration is 30 min-4 h to prepare zinc oxide nano-particles. In some embodiments, the mixing of the zinc salt solution and the first lye is processed by dissolving the zinc salt at room temperature (5° C.-40° C.) to obtain the zinc salt solution, and dissolving or diluting the alkali at room temperature to obtain the first lye; the temperature of the zinc salt solution is adjusted to 0-70° C., and the first lye is then added. In this case, the added alkali reacts with the zinc salt in the zinc salt solution to form zinc oxide nano-particles, and good particle dispersion can be obtained. When the reaction temperature is lower than 0° C., the formation of the zinc oxide nano-particles will be significantly slowed down, and the reaction can be achieved with the help of special equipment, which increases the difficulty of the reaction. Even under some conditions, it is not easy to produce the zinc oxide nano-particles, but only hydroxide intermediates can be obtained. However, when the reaction temperature is higher than 70° C., the reactivity is too high, the produced zinc oxide nano-particles are seriously agglomerated, and it is difficult to get a colloidal solution have a good dispersion, which affects the late film formation of the zinc oxide colloidal solution. In some embodiment, the reaction temperature between the zinc salt solution and the first lye is room temperature (about 50° C.), in this case, it is not only conducive to the formation of the zinc oxide nano-particles, but also the obtained zinc oxide ions have a good particle dispersion, which is conducive to the film formation of the zinc oxide colloidal solution. In some embodiments, a qualified zinc oxide colloidal solution can be easily produced by mixing the zinc salt solution with the first lye at a temperature of 0-30° C. In some embodiments, a zinc oxide colloidal solution can also be produced at a temperature of 30° C.-70° C., and the quality of the obtained zinc oxide colloidal solution is not as good as the zinc oxide colloidal solution produced at 0-30° C., and the reaction time is also reduced. In some embodiments, after the zinc salt solution is mixed with the first lye, and the reaction temperature is 0-70° C. and the reaction duration is carried out for 30 min-4 h to ensure the formation of the zinc oxide nano-particles, and the particle size of the nano-particles is controlled. When the reaction duration is less than 30 min, zinc oxide cluster seeds are obtained with too low reaction duration. In this case, the crystal state of the sample is incomplete and the crystal structure is poor. If the sample is used as the electron transport layer material, the conductivity of the electron transport layer will be poor. However, when the reaction duration is more than 4 h, the long particle growth time will cause the produced nano-particles to be too large and the particle size is not uniform, and the surface roughness of the zinc oxide colloidal solution will be higher after film formation, which will affect the electron transport performance. In some embodiments, the zinc salt solution is mixed with the first lye and reacts at the reaction temperature for 1-2 h.

In some embodiments, the zinc salt solution is mixed with the first lye at a temperature of 0-70° C., and the reaction duration is carried out for 30 min-4 h under the condition of agitation to promote the uniformity of the reaction and the particle uniformity of the obtained zinc oxide nano-particles, and the zinc oxide nano-particles with uniform size are obtained.

In the embodiment of the present application, after the reaction is completed, a precipitating agent is added to the mixed solution after the reaction is completed, and the precipitate is collected. The selection and addition ratio of the precipitating agent mentioned above is the same as the first embodiment in step S11.

In the embodiment of the present application, the precipitation-treated mixed system is centrifuged to collect the precipitate. The embodiment of the present application uses a reaction solvent to clean the collected precipitate to remove reactants that are not involved in the reaction. In order to improve the purity of the zinc oxide nano-particles, the excess zinc salt, the alkali, and other raw materials are removed by cleaning the obtained zinc oxide nano-particles using the reaction solvent. It should be noted that the reaction solvent is mentioned as above. In some embodiments, the reaction solvent is at least one selected from a group of water, an organic alcohol, an organic ether, a sulfone. The polarity of this kind of reaction solvent is large, and it can effectively remove the residual zinc salt, alkali and other raw material impurities and intermediate impurities in zinc oxide nano-particles. As an example, the solvent is at least one selected from a group of water, a methanol, an ethanol, a propanol, a butanol, an ethylene glycol, an ethylene glycol monomethyl ether, and a dimethyl sulfoxide (DMSO).

The zinc oxide colloidal solution is obtained by dissolving the precipitate after cleaning.

In the above step S22, the second lye is added to the zinc oxide colloidal solution to adjust the pH value of the zinc oxide colloidal solution to be greater than or equal to 8. The hydroxyl ligands on the surface of zinc oxide form a dynamic balance with the ionized hydroxyl groups in the colloidal solution of zinc oxide, and the adding of the second lye above will break this balance. Specifically, after the second lye is added, the hydroxyl content in ionized state of the zinc oxide colloidal solution increases, so that the amount of hydroxyl ligand on the surface of zinc oxide will also increase accordingly. However, the amount of alkali added to the second lye can not be too much (pH value can not be too large), otherwise it will make the zinc oxide particles react into zinc hydroxide, the concentration of the zinc oxide colloidal solution is reduced. Therefore, in some embodiments, by adding the second lye to adjust the pH value of the zinc oxide colloidal solution to be between 9 and 12, the zinc oxide nano-particles can also have a higher yield (concentration) on the basis of making the surface hydroxyl content of the obtained zinc oxide greater than or equal to 0.6. In some embodiments, the pH value of the zinc oxide colloidal solution is adjusted between 9 and 10 by adding the second lye.

In the embodiment of the present application, the alkali in the second lye can select an inorganic alkali or an organic base; which can select a strong alkali or a weak base. In some embodiments, the second lye is at least one selected from a group of a potassium hydroxide, a sodium hydroxide, a lithium hydroxide, a tetramethylammonium hydroxide (TMAH), an ammonia, an ethanolamine, and an ethylenediamine In the embodiments of the present application, the second lye is a solution formed by dissolution of an inorganic alkali or a solution formed by dissolution or dilution of an organic base. By dissolving or diluting the alkali, the concentration of the second lye is adjusted to control the reaction rate, so that the adjustment of the surface hydroxyl content of the zinc oxide nano-particles can be fully carried out. A solvent for dissolving or diluting an alkali to form the second lye, capable of dissolving or miscible with the alkali, in addition, the solvent has the same polarity as that of the zinc oxide nano-particles. In some embodiments, the solvent used to dissolve or dilute the alkali to form the second lye may be the same or different from the solvent in the zinc salt solution. In some embodiments, the solvent used to dissolve or dilute the alkali to form the second lye includes but is not limited to water, an organic alcohol, an organic ether, a sulfone and other solvents with greater polarity. In some embodiments, the solvent is at least one selected from a group of water, an organic alcohol, an organic ether, and a sulfone. As an example, the solvent is at least one selected from a group of water, a methanol, an ethanol, a propanol, butanol, an ethylene glycol, an ethylene glycol monomethyl ether, and a dimethyl sulfoxide (DMSO).

Figure 3:
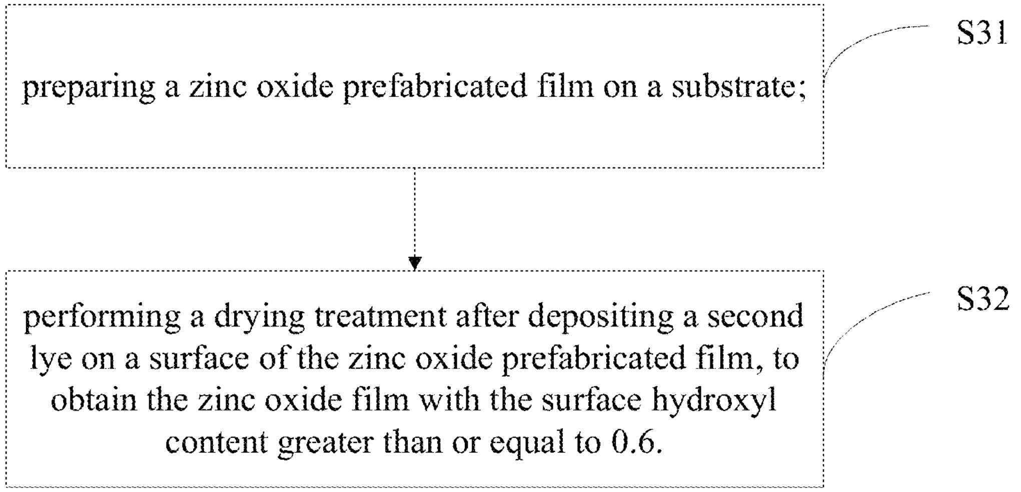
FIG. 3 is the flowchart of a third method for controlling a surface hydroxyl content of a zinc oxide greater than or equal to 0.6 provided by an embodiment of the present application.

In the third possible embodiment, as shown in FIG. 3, the zinc oxide is a zinc oxide film, and the method for controlling the surface hydroxyl content of the zinc oxide includes:

S31; preparing a zinc oxide prefabricated film on a substrate; and

S32; performing a drying treatment after depositing a second lye on a surface of the zinc oxide prefabricated film, to obtain the zinc oxide film with the surface hydroxyl content greater than or equal to 0.6.

In the embodiment, the zinc oxide prefabricated film is treated with the alkali, and a liquid film is formed on the surface of the zinc oxide film, so that the surface hydroxyl content of the zinc oxide prefabricated film will form a dynamic balance with the alkali content in the liquid film, and then the surface hydroxyl content of the zinc oxide prefabricated film will be increased to obtain the zinc oxide with the surface hydroxyl content greater than or equal to 0.6. In this case, by using the zinc oxide film with the surface hydroxyl content greater than or equal to 0.6 as the electron transport layer, the transmission of electrons to the quantum dot light-emitting layer is inhibited, and the electrons injected into the quantum dot light-emitting layer are reduced, which makes the hole electron injection in the quantum dot light-emitting diode more balanced, and finally improves the device lifetime.

In the above step S31, the zinc oxide prefabricated film can be prepared by a variety of ways. For example, the zinc oxide prefabricated film can be prepared by solution method or sol-gel method.

In some embodiments, the zinc oxide prefabricated film is prepared by solution method, including: zinc salt solution is mixed with the first lye at the temperature of 0-70° C., and the reaction duration is 30 min-4 h to prepare zinc oxide; the zinc oxide colloidal solution is obtained by dissolving the zinc oxide. The zinc oxide colloidal solution is formed on the prefabricated device substrate of the zinc oxide film with surface hydroxyl content greater than or equal to 0.6, and the solvent is removed to prepare the prefabricated zinc oxide film.

The zinc oxide colloidal solution is prepared by a solution method, the solution method can be one of an alcoholysis method, a hydrolysis method, etc. The basic process of preparation of zinc oxide by solution method is as follows: mixing the zinc salt solution with the first lye, reacting to produce hydroxide intermediates such as zinc hydroxide; and the zinc oxide nano-particles are gradually formed by polycondensation of hydroxide intermediates.

In the embodiments of the present application, the selection basis and type of zinc salt solution, zinc salt and solvent in zinc salt solution, the selection basis and type of the first lye, the alkali and solvent in the first lye, and the formation method of the first lye are the same as the first embodiment mentioned above, and the addition ratio of the zinc salt and the alkali in the first lye, etc., are the same as the first embodiment mentioned above in step S11.

In some embodiments, the zinc salt solution is mixed with the first lye at a temperature of 0-70° C., and the reaction duration is 30 min-4 h to prepare zinc oxide nano-particles. In some embodiments, the mixing of the zinc salt solution and the first lye is processed by dissolving the zinc salt at room temperature (5° C.-40° C.) to obtain the zinc salt solution, and dissolving or diluting the alkali at room temperature to obtain the first lye; the temperature of the zinc salt solution is adjusted to 0-70° C., and the first lye is then added. In this case, the added alkali reacts with the zinc salt in the zinc salt solution to form zinc oxide nano-particles, and good particle dispersion can be obtained. When the reaction temperature is lower than 0° C., the formation of the zinc oxide nano-particles will be significantly slowed down, and the reaction can be achieved with the help of special equipment, which increases the difficulty of the reaction. Even under some conditions, it is not easy to generate the zinc oxide nano-particles, but only hydroxide intermediates can be obtained. However, when the reaction temperature is higher than 70° C., the reactivity is too high, the generated zinc oxide nano-particles are seriously agglomerated, and it is difficult to get a colloidal solution have a good dispersion, which affects the late film formation of the zinc oxide colloidal solution. In some embodiment, the reaction temperature between the zinc salt solution and the first lye is room temperature (about 50° C.), in this case, it is not only conducive to the formation of the zinc oxide nano-particles, but also the obtained zinc oxide ions have a good particle dispersion, which is conducive to the film formation of the zinc oxide colloidal solution.

In some embodiments, a qualified zinc oxide colloidal solution can be easily generated by mixing the zinc salt solution with the first lye at a temperature of 0-30° C. In some embodiments, a zinc oxide colloidal solution can also be generated at a temperature of 30° C.-70° C., and the quality of the obtained zinc oxide colloidal solution is not as good as the zinc oxide colloidal solution generated at 0-30° C., and the reaction time is also reduced.

In some embodiments, after the zinc salt solution is mixed with the first lye, and the reaction temperature is 0-70° C. and the reaction duration is carried out for 30 min-4 h to ensure the formation of the zinc oxide nano-particles, and the particle size of the nano-particles is controlled.

When the reaction duration is less than 30 min, zinc oxide cluster seeds are obtained with too low reaction duration. In this case, the crystal state of the sample is incomplete and the crystal structure is poor. If the sample is used as the electron transport layer material, the conductivity of the electron transport layer will be poor. However, when the reaction duration is more than 4 h, the long particle growth time will cause the generated nano-particles to be too large and the particle size is not uniform, and the surface roughness of the zinc oxide colloidal solution will be higher after film formation, which will affect the electron transport performance. In some embodiments, the zinc salt solution is mixed with the first lye and reacts at the reaction temperature for 1-2 h.

In some embodiments, the zinc salt solution is mixed with the first lye at a temperature of 0-70° C., and the reaction duration is carried out for 30 min-4 h under the condition of agitation to promote the uniformity of the reaction and the particle uniformity of the obtained zinc oxide nano-particles, and the zinc oxide nano-particles with uniform size are prepared.

In the embodiment of the present application, the zinc oxide colloidal solution can be obtained by dissolving the prepared zinc oxide nano-particles.

In some embodiments, the method of obtaining the zinc oxide nano-particles further includes: adding a precipitating agent to the mixed solution after the reaction is completed, and then collecting the precipitate. The selection and addition ratio of the precipitating agent mentioned above is the same as the first embodiment in step S11.

In the embodiment of the present application, the precipitation-treated mixed system is centrifuged to collect the precipitate. The embodiment of the present application uses a reaction solvent to clean the collected precipitate to remove reactants that are not involved in the reaction. In order to improve the purity of the zinc oxide nano-particles, the excess zinc salt, the alkali, and other raw materials are removed by cleaning the obtained zinc oxide nano-particles using the reaction solvent. It should be noted that the reaction solvent is mentioned as above. In some embodiments, the reaction solvent is at least one selected from a group of water, an organic alcohol, an organic ether, a sulfone. As an example, the solvent is at least one selected from a group of water, a methanol, an ethanol, a propanol, a butanol, an ethylene glycol, an ethylene glycol monomethyl ether, and a dimethyl sulfoxide (DMSO).

After cleaning, the white precipitate is obtained, and the white precipitate is dissolved to obtain zinc oxide colloidal solution.

In embodiments of the present application, the substrate for the preparation of the zinc oxide prefabricated film is depending on the type of the quantum dot light-emitting diode device being prepared. In some embodiments, the zinc oxide colloidal solution is formed on the substrate of a prefabricated device to prepare a zinc oxide film with the surface hydroxyl content greater than or equal to 0.6, the solvent is removed, and the zinc oxide film with the surface hydroxyl content greater than or equal to 0.6 is prepared.

In some embodiments, the zinc oxide colloidal solution is formed on the substrate using one of the following methods, including but not limited to a spinning coating method, a scraping coating method, a printing method, a spraying method, a rolling coating method, an electrodeposition method, etc. After the zinc oxide colloidal solution is formed on the substrate, the solvent is removed by annealing treatment, and the zinc oxide prefabricated film with surface hydroxyl content greater than or equal to 0.6 is obtained.

In some embodiments, the zinc oxide prefabricated film is prepared by sol-gel method (high-temperature calcination method), in particular, the zinc oxide precursor is directly spun onto the substrate to be prepared, and then heat treated at high temperature to turn it into the zinc oxide.

In the above step S32, the surface hydroxyl content of the zinc oxide prefabricated film is changed by depositing the second lye on the zinc oxide prefabricated film. Specifically, when the second lye is deposited, the surface of the prefabricated zinc oxide film will form a liquid film, so the surface hydroxyl content of the prefabricated zinc oxide film will form a dynamic balance with the alkali content in the liquid film, therefore the surface hydroxyl content of the prefabricated zinc oxide film is increased.

In the embodiment of the present application, the alkali in the second lye can select an inorganic alkali or an organic base; which can select a strong alkali or a weak base. In some embodiments, the second lye is at least one selected from a group of a potassium hydroxide, a sodium hydroxide, a lithium hydroxide, a tetramethylammonium hydroxide (TMAH), an ammonia, an ethanolamine, and an ethylenediamine In the embodiments of the present application, the second lye is a solution formed by dissolution of an inorganic alkali or a solution formed by dissolution or dilution of an organic base. By dissolving or diluting the alkali, the concentration of the second lye is adjusted to control the reaction rate, so that the adjustment of the surface hydroxyl content of the zinc oxide nano-particles can be fully carried out. A solvent for dissolving or diluting an alkali to form the second lye, capable of dissolving or miscible with the alkali, in addition, the solvent has the same polarity as that of the zinc oxide nano-particles. In some embodiments, the solvent used to dissolve or dilute the alkali to form the second lye may be the same or different from the solvent in the zinc salt solution. In some embodiments, the solvent used to dissolve or dilute the alkali to form the second lye includes but is not limited to water, an organic alcohol, an organic ether, a sulfone and other solvents with greater polarity. In some embodiments, the solvent is at least one selected from a group of water, an organic alcohol, an organic ether, and a sulfone. As an example, the solvent is at least one selected from a group of water, a methanol, an ethanol, a propanol, butanol, an ethylene glycol, an ethylene glycol monomethyl ether, and a dimethyl sulfoxide (DMSO).

In the embodiments of the present application, the concentration and addition amount of the alkali solution need to be controlled. This is because: when the concentration and addition amount of the alkali are too large, a large number of zinc hydroxide impurities will produced on the surface of the prefabricated zinc oxide film, which affects the quality of the zinc oxide film; when the concentration and addition amount of the alkali are too small, it is not easy to increase the surface hydroxyl content of the zinc oxide. In some embodiments, the concentration of the second lye is 0.05-0.5 mmol/L to obtain a suitable concentration to regulate the surface hydroxyl content of the zinc oxide prefabricated film. In some embodiments, the deposited amount of the second lye and the weight of the underlying zinc oxide prefabricated film meet that: every 5 mg zinc oxide prefabricated film is treated with the second lye of 50 μL-1000 μL. When the concentration and addition amount of the second lye are too large, a large number of zinc hydroxide impurities will produced on the surface of the prefabricated zinc oxide film, which affects the quality of the zinc oxide film; and when the concentration and addition amount of the second lye are too small, it is not easy to increase the surface hydroxyl content of the zinc oxide. It should be understood that the concentration of the second lye can be flexibly adjusted according to the different types of alkalies selected.

The inorganic alkali is generally a strong alkali, and the ionization ability of hydroxide ion is strong, so only a small amount of low concentration of the inorganic alkali can adjust the surface hydroxyl content of the zinc oxide. The organic alkali is generally a weak alkali, and the ionization ability of hydroxide ion is weak, so a relatively high concentration of the organic alkali is needed to effectively adjust the surface hydroxyl content of the zinc oxide.

In some embodiments, the alkali in the second lye is an inorganic alkali, and the concentration of the second lye is 0.05-0.1 mmol/L. As an example, the inorganic alkali is at least one selected from a group of a potassium hydroxide, a sodium hydroxide, and a lithium hydroxide.

In this case, the deposited amount of the second lye and the weight of the underlying zinc oxide prefabricated film meet that: every 5 mg zinc oxide prefabricated film is treated with the second lye of 50 μL-400 μL.

In some embodiments, the alkali in the second lye is an organic alkali, in which case the corresponding concentration of the second lye formed is 0.2-0.4 mmol/L. As an example, the organic carboxylic acid is at least one selected from a group of a TMAH, an ammonia, an ethanolamine, and an ethylenediamine. In this case, the deposited amount of the second lye and the weight of the underlying zinc oxide prefabricated film meet that: every 5 mg zinc oxide prefabricated film is treated with the second lye of 500 μL-1000 μL.

In the embodiments of the present application, the method of depositing a second lye on the surface of the zinc oxide prefabricated film may adopt a solution processing method, including but not limited to one of a spinning coating method, a scraping coating method, a printing method, a spraying method, a rolling coating method and an electrodeposition method.

Performing a drying treatment after depositing a second lye on a surface of the zinc oxide prefabricated film, the ionized hydrogen ions in the second lye can fully react with the surface hydroxyl of the zinc oxide by the drying treatment. In some embodiments, the temperature of the drying treatment is 10° C.-100° C., and the drying duration is 10 minutes-2 hours. In this case, the ionized hydrogen ions in the second lye react sufficiently with the surface hydroxyl of the zinc oxide to increase the surface hydroxyl content of the zinc oxide. When the drying temperature is too high or the drying duration is too long, it will lead to the rapid drying of the second lye, and the prefabricated film of zinc oxide is rapidly become a solid film, so that the ionized hydrogen ions in the second lye and the surface hydroxyl of the zinc oxide are not easy to be fully reacted, and it is not easy to fully reduce the surface hydroxyl content of the zinc oxide. However, when the drying temperature is too low or the drying duration is too short, it will cause the zinc oxide prefabricated film to be difficult to be fully dried, which affects the preparation of the next layer, especially affects the evaporation quality of the electrodes. In some embodiments, the temperature of the drying treatment is 10° C.-50° C., and the drying duration is 30 minutes-2 hours. By changing the surface hydroxyl content of the zinc oxide, the surface of the film obtained finally may retain a very small amount of alkali forming an auxiliary layer.

In the second embodiment, the surface hydroxyl content of the zinc oxide is controlled to be less than or equal to 0.4 during the preparation of the zinc oxide. By using a zinc oxide film with a surface hydroxyl content less than or equal to 0.4 as the electron transport layer, the transmission of electrons to the quantum dot light-emitting layer becomes smooth, and the amount of electrons injected into the quantum dot light-emitting layer increases, so that the injection rate of electrons into the quantum dot light-emitting layer is higher than that of holes into the quantum dot light-emitting layer, which will cause the quantum dots in the quantum dot light-emitting layer to be negatively charged. This negatively charged state can be maintained due to the core-shell structure of quantum dots and the binding effect of electrically inert surface ligands, while the coulomb repulsion effect makes further injection of electrons into the quantum dot light-emitting layer more and more difficult. When the quantum dot light-emitting diode device continues to light up and work to a stable state, the negatively charged state of the quantum dot also tends to be stable, that is, the electrons newly trapped and bound by the quantum dot reach a dynamic balance with the electrons consumed by the radiation transition, and the injection rate of electrons into the quantum dot light-emitting layer is much lower than that in the initial stage. At this time, the lower electron injection rate and hole injection rate just reach the carrier injection balance, so that the device lifetime is improved. In other words, although at the initial stage of the work of the quantum dot light-emitting diode device, the higher electron injection rate will cause the quantum dot light-emitting diode device to be in the unbalanced state of carrier injection, which will affect the device performance. However, when the quantum dot light-emitting diode device continues to light up and work to a stable state, the reduced electron injection rate will form a carrier injection balance with the hole injection rate, and the device efficiency will be maintained continuously, thus the lifetime of the quantum dot light-emitting diode device is effectively improved.

In the process of preparing the zinc oxide, controlling the surface hydroxyl content of the zinc oxide being less than or equal to 0.4, which can be achieved in several ways.

Figure 4:
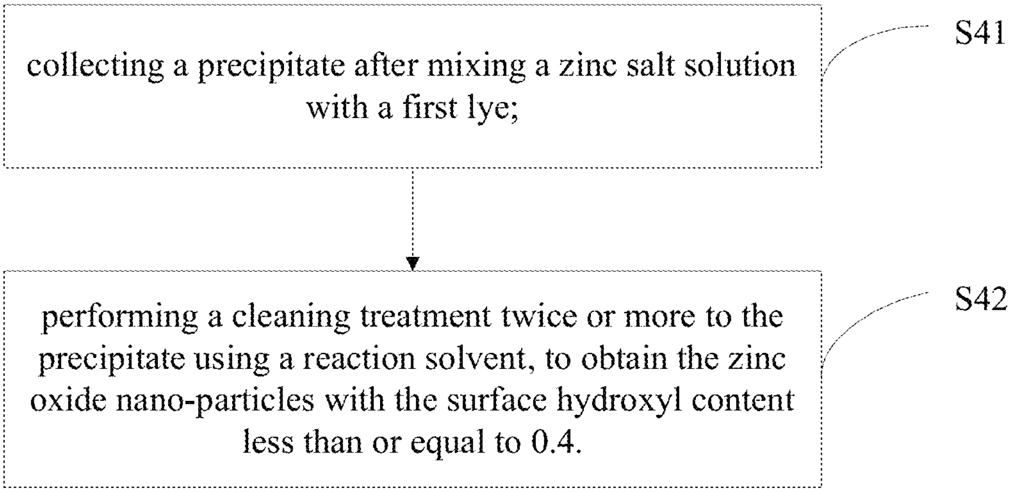
FIG. 4 is the flowchart of a first method for controlling a surface hydroxyl content of a zinc oxide less than or equal to 0.4 provided by an embodiment of the present application.

In the first possible embodiment, as shown in FIG. 4, the zinc oxide is zinc oxide nano-particles, and the method for controlling the surface hydroxyl content of the zinc oxide includes:

- S41; collecting a precipitate after mixing a zinc salt solution with a first lye; and
- S42; performing a cleaning treatment twice or more to the precipitate using a reaction solvent, to obtain the zinc oxide nano-particles with the surface hydroxyl content less than or equal to 0.4.

The embodiment uses the solution method to prepare a zinc oxide colloidal solution as a film forming solution for a zinc oxide film with a surface hydroxyl content less than or equal to In the preparation process of the zinc oxide colloidal solution prepared by solution method, the cleaning treatment is performed twice or more to the precipitate obtained using a reaction solvent, to obtain the zinc oxide nano-particles with the surface hydroxyl content less than or equal to 0.4. By using a zinc oxide film with a surface hydroxyl content less than or equal to 0.4 as the electron transport layer, the transmission of electrons to the quantum dot light-emitting layer becomes smooth, and the amount of electrons injected into the quantum dot light-emitting layer increases, so that the injection rate of electrons into the quantum dot light-emitting layer is higher than that of holes into the quantum dot light-emitting layer, which will cause the quantum dots in the quantum dot light-emitting layer to be negatively charged. This negatively charged state can be maintained due to the core-shell structure of quantum dots and the binding effect of electrically inert surface ligands, while the coulomb repulsion effect makes further injection of electrons into the quantum dot light-emitting layer more and more difficult. When the quantum dot light-emitting diode device continues to light up and work to a stable state, the negatively charged state of the quantum dot also tends to be stable, that is, the electrons newly trapped and bound by the quantum dot reach a dynamic balance with the electrons consumed by the radiation transition, and the injection rate of electrons into the quantum dot light-emitting layer is much lower than that in the initial stage. At this time, the lower electron injection rate and hole injection rate just reach the carrier injection balance, so that the device lifetime is improved.

The step in step S41 is the same as that of in step S11.

Since the zinc oxide nano-particles are formed by the reaction of the zinc salt and the alkali in the embodiment of the present application, in the polar zinc oxide solution, due to the characteristics of the zinc oxide colloidal itself, the surface of the zinc oxide colloidal adsorbs a large number of ionized hydroxyl groups. These hydroxyl groups are negatively charged and adsorbed on the surface of the zinc oxide nano-particles in large quantities, making the surface of the zinc oxide nano-particles also negatively charged. Under the action of electrostatic coulomb repulsion between the zinc oxide nano-particles, the zinc oxide nano-particles can be dispersed in polar solution, and have good solution stability and dispersion. When the zinc oxide colloidal solution is deposited into a zinc oxide film, a large number of hydroxyl groups will still cover the surface of the zinc oxide particles after curing the film. When the zinc oxide film is used as the electron transport layer in the quantum dot light-emitting diode, due to the adsorption of a large number of negatively charged hydroxyl groups on the surface of the zinc oxide, the transmission of electrons in the zinc oxide layer will play a certain inhibition and obstruction role, so the surface hydroxyl content of the zinc oxide film will directly affect the injection of electrons in the quantum dot light-emitting diode device. When the surface hydroxyl content of the zinc oxide is more, the transmission of electrons in the quantum dot light-emitting diode device will be inhibited, and the injected electrons in the quantum dot light-emitting layer will be reduced. When the surface hydroxyl content of the zinc oxide is small, the transmission of electrons in the quantum dot light-emitting diode device will be smooth, and the injection of electrons in the quantum dot light-emitting layer will be increased. Therefore, in the above step S42, the surface hydroxyl content of the obtained zinc oxide nano-particles is adjusted by controlling the number of cleaning times.

Specifically, when the cleaning times to the zinc oxide nano-particles are more, the residual hydroxyl content on the surface is correspondingly less; when the cleaning times of the zinc oxide nano-particles are more, the residual hydroxyl content on the surface is correspondingly less. The embodiment of the present application uses a reaction solvent to perform cleaning treatment twice or more to the precipitate, so that the surface hydroxyl content of the zinc oxide nano-particles is less than or equal to 0.4.

In one possible embodiment, if the alkali in the first lye is an alkali having $K_b>10^{-1}$, and the number of cleaning treatments is greater than or equal to 3. In this case, due to the large ionization coefficient of the alkali having $K_b>10^{-1}$, so that the surface hydroxyl content of the final synthesized zinc oxide colloidal is more, the final synthesized zinc oxide colloidal surface contains more hydroxyl, so the cleaning times are greater than or equal to 3 times to achieve less surface hydroxyl content.

In one possible embodiment, if the alkali in the first lye is an alkali having $K_b<10^{-1}$, and the number of cleaning treatments is less than or equal to 2. When the reaction alkali is an alkali having $K_b<10^{-1}$, due to the small ionization coefficient of the alkali, the surface hydroxyl content of the final synthesized zinc oxide colloidal is less, so the cleaning times are greater than or equal to 2 times to achieve more surface hydroxyl content.

The selection of the alkali of different $K_b$ can refer to the above. For example, the alkali having $K_b>10^{-1}$ includes but is not limited to strong inorganic alkalies such as a potassium hydroxide, a sodium hydroxide, and a lithium hydroxide; and the alkali having $K_b<10^{-1}$ includes but is not limited to a tetramethylammonium hydroxide (TMAH), an ammonia, an ethanolamine, an ethylenediamine, and other organic weak alkalies.

In some embodiments, the alkali in the first lye is at least one selected from a group of a potassium hydroxide, a sodium hydroxide, and a lithium hydroxide, the number of cleaning times to the collected precipitate using the reaction solvent is 3 to 5 times, and zinc oxide nano-particles with a surface hydroxyl content less than or equal to 0.4 can be obtained. In some embodiments, the alkali in the first lye is at least one selected from a group of a tetramethylammonium hydroxide (TMAH), an ammonia, an ethanolamine, and an ethylenediamine, the number of cleaning times to the collected precipitate using the reaction solvent is 2 to 4 times, and zinc oxide nano-particles with a surface hydroxyl content less than or equal to 0.4 can be obtained.

Figure 5:
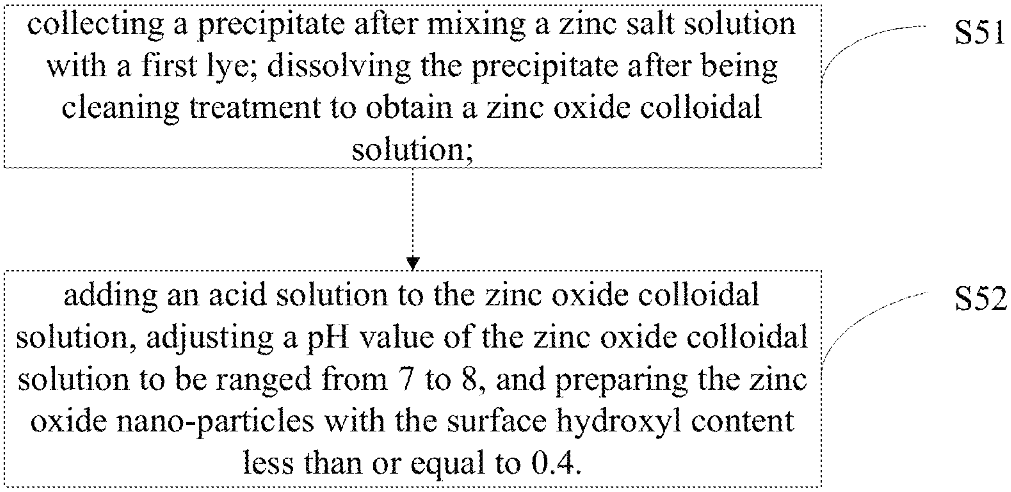
FIG. 5 is the flowchart of a second method for controlling a surface hydroxyl content of a zinc oxide less than or equal to 0.4 provided by an embodiment of the present application.

In the second possible realization, as shown in FIG. 5, the zinc oxide is zinc oxide nano-particles and a method of controlling the surface hydroxyl content of the zinc oxide includes:

S51; collecting a precipitate after mixing a zinc salt solution with a first lye; dissolving the precipitate after being cleaning treatment to obtain a zinc oxide colloidal solution; and

S52; adding an acid solution to the zinc oxide colloidal solution, adjusting a pH value of the zinc oxide colloidal solution to be ranged from 7 to 8, and preparing the zinc oxide nano-particles with the surface hydroxyl content less than or equal to 0.4.

The embodiment first uses the solution method to prepare the zinc oxide colloidal solution, the acid solution is then added to the zinc oxide colloidal solution, the pH value of the zinc oxide colloidal solution is adjusted to be 7 to 8, and the zinc oxide solution is obtained, so as to obtain the zinc oxide with a surface hydroxyl content less than or equal to 0.4. By using a zinc oxide film with a surface hydroxyl content less than or equal to 0.4 as the electron transport layer, the transmission of electrons to the quantum dot light-emitting layer becomes smooth, and the amount of electrons injected into the quantum dot light-emitting layer increases, so that the injection rate of electrons into the quantum dot light-emitting layer is higher than that of holes into the quantum dot light-emitting layer, which will cause the quantum dots in the quantum dot light-emitting layer to be negatively charged. This negatively charged state can be maintained due to the core-shell structure of quantum dots and the binding effect of electrically inert surface ligands, while the coulomb repulsion effect makes further injection of electrons into the quantum dot light-emitting layer more and more difficult. When the quantum dot light-emitting diode device continues to light up and work to a stable state, the negatively charged state of the quantum dot also tends to be stable, that is, the electrons newly trapped and bound by the quantum dot reach a dynamic balance with the electrons consumed by the radiation transition, and the injection rate of electrons into the quantum dot light-emitting layer is much lower than that in the initial stage. At this time, the lower electron injection rate and hole injection rate just reach the carrier injection balance, so that the device lifetime is improved.

The step S51 above is the same as the step S21 above.

In the above step S52, adding an acid solution to the zinc oxide colloidal solution, adjusting a pH value of the zinc oxide colloidal solution to be ranged from 7 to 8. The hydroxyl ligands on the surface of the zinc oxide form a dynamic balance with the ionized hydroxyl in the zinc oxide colloidal solution, and the adding of the above acid solution will break this balance. Specifically, after the acid solution is added, the ionized hydroxyl content in the zinc oxide colloidal solution is reduced, and the amount of the hydroxyl ligand on the surface of the zinc oxide is also reduced accordingly. However, at the same time, the amount of acid added to the solution should not be too much (pH value should not be too small), otherwise the hydroxyl ligands on the surface of the zinc oxide will be too small, which makes the surface of zinc oxide to lose ligands protection, and results in serious aggregation or even precipitation of the zinc oxide particles. Therefore, the pH value of the zinc oxide colloidal solution is adjusted to be between 7-8 by adding the acid solution in the present application embodiment. In some embodiments, the pH value of the zinc oxide colloidal solution is adjusted to be between 7.2-7.8 by adding the acid solution, and on the basis of making the surface hydroxyl content of the zinc oxide less than or equal to 0.4, the surface of the zinc oxide nano-particles can also contain certain hydroxyl ligands, thus a good dispersion can be obtained. In some embodiments, the pH value of the zinc oxide colloidal solution is adjusted to be between 7.3-7.6 by adding the acid solution.

In some embodiments, the acid in the acid solution is at least one strong inorganic acid selected from a group of a hydrochloric acid, a sulfuric acid, a nitric acid, and a hydrofluoric acid, or at least one organic carboxylic acid selected from a group of a formic acid, an acetic acid, a propionic acid, an oxalic acid, and an acrylic acid. In the embodiments of the present application, the acid is a solution formed by dissolution of a inorganic acid or a solution formed by dissolution or dilution of an organic acid. By dissolving or diluting the acid and adjusting the concentration of the acid, the reaction rate is controlled, so that the adjustment of the surface hydroxyl of the zinc oxide nano-particles can be fully carried out. The solvent used to dissolve or dilute the acid to form an acid solution is capable of dissolving the acid or miscible with the acid, and the solvent has the same polarity as the zinc oxide nano-particles. In some embodiments, the solvent used to dissolve or dilute the acid to form the acid solution may be the same as or different from the solvent in the zinc salt solution. In some embodiments, the solvent used to dissolve or dilute the acid to form the acid solution includes, but is not limited to, water, an organic alcohol, an organic ether, a sulfone, and other highly polar solvents. As an example, the solvent may be at least one of water, a methanol, an ethanol, a propanol, a butanol, an ethylene glycol, an ethylene glycol monomethyl ether, or a dimethyl sulfoxide (DMSO).

Figure 6:
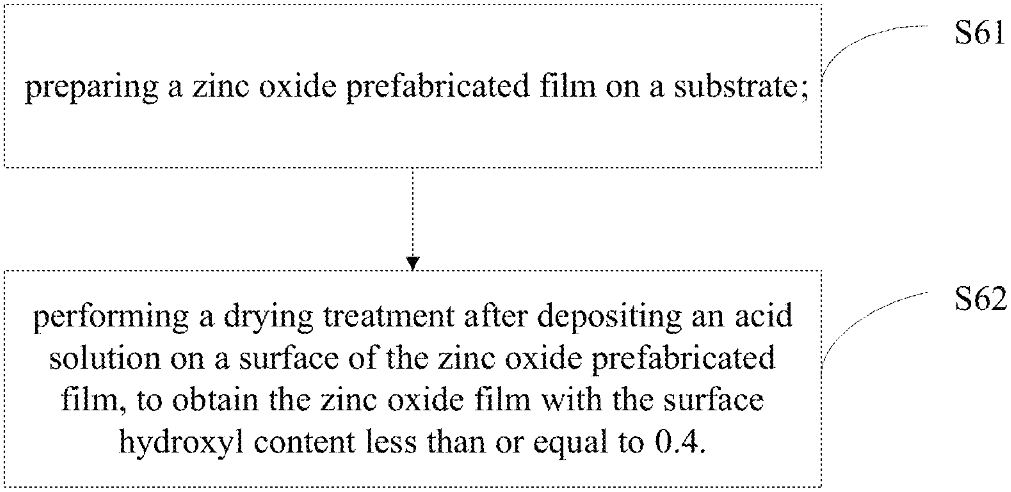
FIG. 6 is the flowchart of a third method for controlling a surface hydroxyl content of a zinc oxide less than or equal to 0.4 provided by an embodiment of the present application.

In the third possible embodiment, as shown in FIG. 6, the zinc oxide is a zinc oxide film, and the method for controlling the surface hydroxyl content of the zinc oxide includes:

S61; preparing a zinc oxide prefabricated film on a substrate; and

S62; performing a drying treatment after depositing an acid solution on a surface of the zinc oxide prefabricated film, to obtain the zinc oxide film with the surface hydroxyl content less than or equal to 0.4.

In the embodiment, the zinc oxide prefabricated film is treated with the acid to obtain the zinc oxide with the surface hydroxyl content less than or equal to 0.4. In this case, by using a zinc oxide film with a surface hydroxyl content less than or equal to 0.4 as the electron transport layer, the transmission of electrons to the quantum dot light-emitting layer becomes smooth, and the amount of electrons injected into the quantum dot light-emitting layer increases, so that the injection rate of electrons into the quantum dot light-emitting layer is higher than that of holes into the quantum dot light-emitting layer, which will cause the quantum dots in the quantum dot light-emitting layer to be negatively charged. This negatively charged state can be maintained due to the core-shell structure of quantum dots and the binding effect of electrically inert surface ligands, while the coulomb repulsion effect makes further injection of electrons into the quantum dot light-emitting layer more and more difficult. When the quantum dot light-emitting diode device continues to light up and work to a stable state, the negatively charged state of the quantum dot also tends to be stable, that is, the electrons newly trapped and bound by the quantum dot reach a dynamic balance with the electrons consumed by the radiation transition, and the injection rate of electrons into the quantum dot light-emitting layer is much lower than that in the initial stage. At this time, the lower electron injection rate and hole injection rate just reach the carrier injection balance, so that the device lifetime is improved.

The step S61 above is the same as the step S31 above.

In the above step S62, the surface hydroxyl content of the zinc oxide prefabricated film is changed by depositing the acid solution on the zinc oxide prefabricated film. Specifically, when the acid solution is deposited, the surface of the prefabricated zinc oxide film will form a liquid film, so the hydroxyl on the surface of the prefabricated zinc oxide film will react with ionized hydrogen ions in the liquid film, thus the surface hydroxyl content of the prefabricated zinc oxide film is reduced.

In some embodiments, the acid in the acid solution includes but is not limited to, at least one strong inorganic acid selected from a group of a hydrochloric acid, a sulfuric acid, a nitric acid, and a hydrofluoric acid, or at least one organic carboxylic acid selected from a group of a formic acid, an acetic acid, a propionic acid, an oxalic acid, and an acrylic acid. In the embodiments of the present application, the acid is a solution formed by dissolution of a inorganic acid, or a solution formed by dissolution or dilution of an organic acid, or the acid is directly an organic carboxylic acid. By dissolving or diluting the acid and adjusting the concentration of the acid, the reaction rate is controlled, so that the adjustment of the surface hydroxyl of the zinc oxide nano-particles can be fully carried out. The solvent used to dissolve or dilute the acid to form an acid solution is capable of dissolving the acid or miscible with the acid, and the solvent has the same polarity as the zinc oxide nano-particles. In some embodiments, the solvent used to dissolve or dilute the acid to form the acid solution may be the same as or different from the solvent in the zinc salt solution. In some embodiments, the solvent used to dissolve or dilute the acid to form the acid solution includes, but is not limited to, water, an organic alcohol, an organic ether, a sulfone, and other highly polar solvents. As an example, the solvent may be at least one of water, a methanol, an ethanol, a propanol, a butanol, an ethylene glycol, an ethylene glycol monomethyl ether, or a dimethyl sulfoxide (DMSO).

In the embodiments of the present application, the concentration and addition amount of the acid solution need to be controlled. This is because: when the concentration and addition amount of the acid are too large, the amount of the hydroxyl ligands on the surface of the zinc oxide will be too small, which results in the loss of ligand protection on the surface of the zinc oxide, and results in serious aggregation of the zinc oxide particles, the quality of the zinc oxide film is affected. However, when the concentration and addition amount of the acid are too small, it is not easy to reduce the surface hydroxyl content of the zinc oxide. In some embodiments, the concentration of the acid solution is 0.05-0.5 mmol/L in order to obtain the appropriate concentration to regulate the surface hydroxyl content of the zinc oxide prefabricated film. In some embodiments, the deposited amount of the acid solution and the weight of the underlying zinc oxide prefabricated film meet that: every 5 mg zinc oxide prefabricated film is treated with the acid solution of 50 μL-1000 μL. When the concentration and addition amount of the acid are too large, the amount of the hydroxyl ligands on the surface of the zinc oxide will be too small, which results in the loss of ligand protection on the surface of the zinc oxide, and results in serious aggregation of the zinc oxide particles, the quality of the zinc oxide film is affected; and when when the concentration and addition amount of the acid are too small, it is not easy to reduce the surface hydroxyl content of the zinc oxide. It should be understood that the concentration of the acid solution can be flexibly adjusted according to the different types of acid selected.

The inorganic acid is generally a strong acid, and the ionization ability of the hydrogen ion is strong, so only a small amount of low concentration of the inorganic acid can adjust the surface hydroxyl content of the zinc oxide. The organic acid is generally a weak acid, and the ionization ability of the hydrogen ions is weak, so a relatively high concentration of the organic acid is needed to effectively adjust the surface hydroxyl content of the zinc oxide.

In some embodiments, the acid in the acid solution is an inorganic acid, and the concentration of the acid solution is 0.05-0.1 mmol/L. The inorganic acid is at least one selected from a group of a hydrochloric acid, a sulfuric acid, a nitric acid, and a hydrofluoric acid. In this case, the deposited amount of the acid solution and the weight of the underlying zinc oxide prefabricated film meet that: every 5 mg zinc oxide prefabricated film is treated with the acid solution of 50 μL-200 μL.

In some embodiments, the acid in the acid solution is an organic carboxylic acid, in which case the corresponding concentration of the acid solution formed is 0.2-0.4 mmol/L. As an example, the organic carboxylic acid is at least one selected from a group of a formic acid, an acetic acid, a propionic acid, an oxalic acid, and an acrylic acid. In this case, the deposited amount of the acid solution and the weight of the underlying zinc oxide prefabricated film meet that: every 5 mg zinc oxide prefabricated film is treated with the acid solution of 100 μL-500 μL.

In the embodiments of the present application, the method of depositing an acid solution on the surface of the zinc oxide prefabricated film may adopt a solution processing method, including but not limited to one of a spinning coating method, a scraping coating method, a printing method, a spraying method, a rolling coating method and an electrodeposition method.

Performing a drying treatment after depositing an acid solution on a surface of the zinc oxide prefabricated film, the ionized hydrogen ions in the acid solution can fully react with the surface hydroxyl of the zinc oxide by the drying treatment. In some embodiments, the temperature of the drying treatment is 10° C.~100° C., and the drying duration is 10 minutes~2 hours. In this case, the ionized hydrogen ions in the acid solution react sufficiently with the surface hydroxyl of the zinc oxide to increase the surface hydroxyl content of the zinc oxide. When the drying temperature is too high or the drying duration is too long, it will lead to the rapid drying of the acid solution, and the prefabricated film of zinc oxide is rapidly become a solid film, so that the ionized hydrogen ions in the acid solution and the surface hydroxyl of the zinc oxide are not easy to be fully reacted, and it is not easy to fully reduce the surface hydroxyl content of the zinc oxide. However, when the drying temperature is too low or the drying duration is too short, it will cause the zinc oxide prefabricated film to be difficult to be fully dried, which affects the preparation of the next layer, especially affects the evaporation quality of the electrodes. In some embodiments, the temperature of the drying treatment is 10° C.~50° C., and the drying duration is 30 minutes~2 hours. By changing the surface hydroxyl content of the zinc oxide, the surface of the film obtained finally may retain a very small amount of acid forming an auxiliary layer.

The following is illustrated in combination with specific embodiments.

Figure 7:
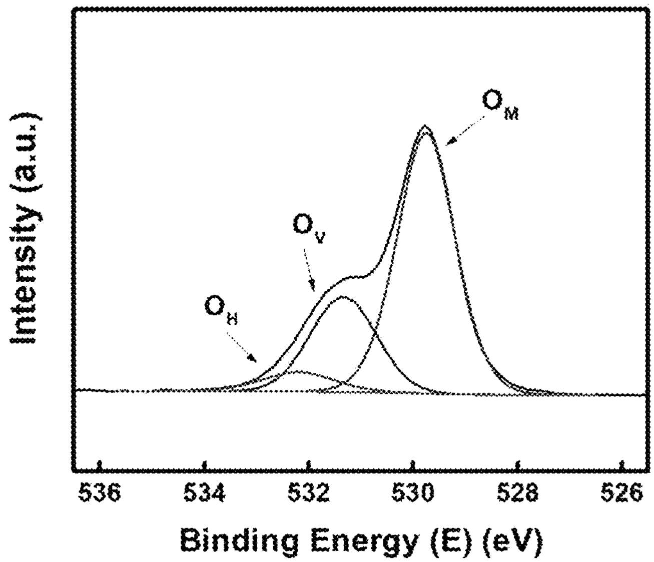
FIG. 7 is the schematic diagram provided by an embodiment of the present application, which uses X-ray photoelectron spectroscopy (XPS) to test a hydroxy-oxygen peak area and a lattice oxygen peak area, and calculates a ratio of the hydroxy-oxygen peak area and the lattice oxygen peak area to obtain a hydroxyl content.

Firstly, three detection methods used in the present application embodiment are introduced:

(1) X-ray photoelectron spectroscopy (XPS) is a surface analysis method that uses X-rays of a certain energy to radiate samples, so that the inner electrons or valence electrons of atoms or molecules are excited to be emitted, and the electrons excited by photons are called photoelectrons, the energy and number of photoelectrons can be measured to obtain the composition of the object to be measured. This technique can effectively distinguish the oxygen in three chemical states of zinc oxide materials, namely lattice oxygen connected to metal atoms, oxygen defects formed in crystal growth and hydroxyl oxygen. When the surface hydroxyl is tested by X-ray photoelectron spectroscopy (XPS), the device model is selected a Thermo Field NEXSA, the method for sample preparation: diluting the prepared zinc oxide solution to 30 mg/mL, spin-coating the prepared zinc oxide solution onto the pre-treated glass sheet, and spin-coating into a film. The calculation method of hydroxyl content: a ratio of a hydroxyl oxygen peak area to a lattice oxygen peak area is the proportion of hydroxyl content:

$$R_{OH} = \frac{A_{OH}}{A_{MO}},$$

as shown in FIG. 7.

(2) External quantum efficiency test method of JVL (Current density-voltage-luminance) device.

Device Model: Keithley 2400/6485

The external quantum efficiency parameters mainly include six parameters: a voltage, a current, a luminance, an external quantum dot efficiency, a power efficiency and a luminescence spectrum; a certain voltage output is carried out in the cassette to make the device to conduct and emit light and record a timely current, the light source is collected through the silicon photodiode, and the spectral data is analyzed, to obtain the color coordinates while calculate the G (λ) human vision function and S (λ) normalized electroluminescence spectrum, so the calculation method of current efficiency ηA is:

$$\eta_A = \frac{L}{J_D}$$

Where L is the luminance read out by the silicon photodiode, $J_D$ is the device current density, and is a ratio of the device area (a) to the current flowing through the device (I).

The calculation method of the external quantum efficiency $\eta_{EQE}$ is:

$$\eta_{EQE} = \frac{q\pi}{hc} \cdot \frac{\int \lambda S(\lambda) d\lambda}{\int G(\lambda) S(\lambda) d\lambda} \cdot \eta_A$$

Where q is the basic charge, h is the Planck's constant, and c is the speed of light in vacuum.

Figure 8:
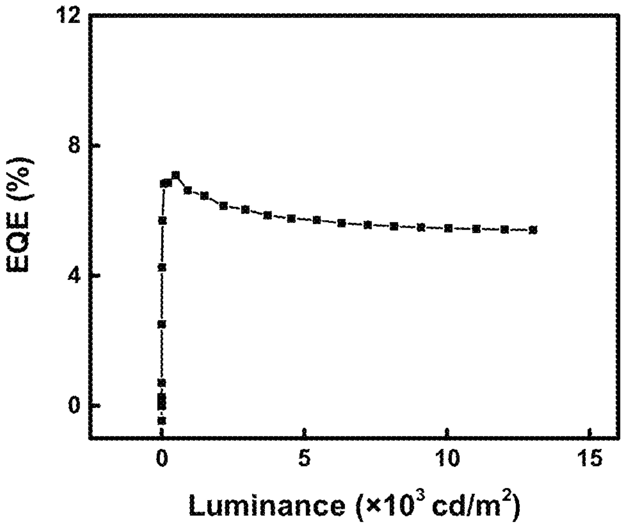
FIG. 8 is a grapH value of an EQE-luminance provided by an embodiment of the present application.

As read from FIG. 8 of the embodiments, the external quantum efficiency of the device is the highest EQE value of the EQE-luminance curve.

(3) QLED lifetime test system

Model: New Vision NVO-QLED-LT-128

Operating Principle:

128-paths QLED lifetime test system communicated through the central processing computer PCI bus controls the digital IO card of NI (National Instruments) to achieve the path selection and digital signal output, the corresponding digital signal is converted to the analog signal through the D/A chip, so as to complete the current output (I), and the data acquisition is achieved through the data acquisition card. The acquisition of brightness converts the light signal into an electrical signal by the sensor, which is used to simulate the luminance change (L).

Test Method:

QLED lifetime test method (constant current method)

(A) Selecting three or four different constant current densities (e.g., 100 mA $cm^2$, 50 mA $cm^2$, 20 mA $cm^2$, and 10 mA $cm^2$) and testing an initial luminance under the appropriate conditions.

(B) Maintaining the constant currents and recording changes in luminance and device voltage over time.

(C) Recording the times of device decay to T95, T80, T75, T50 at different constant currents.

(D) Calculating the acceleration factors by curve fitting.

Figure 9:
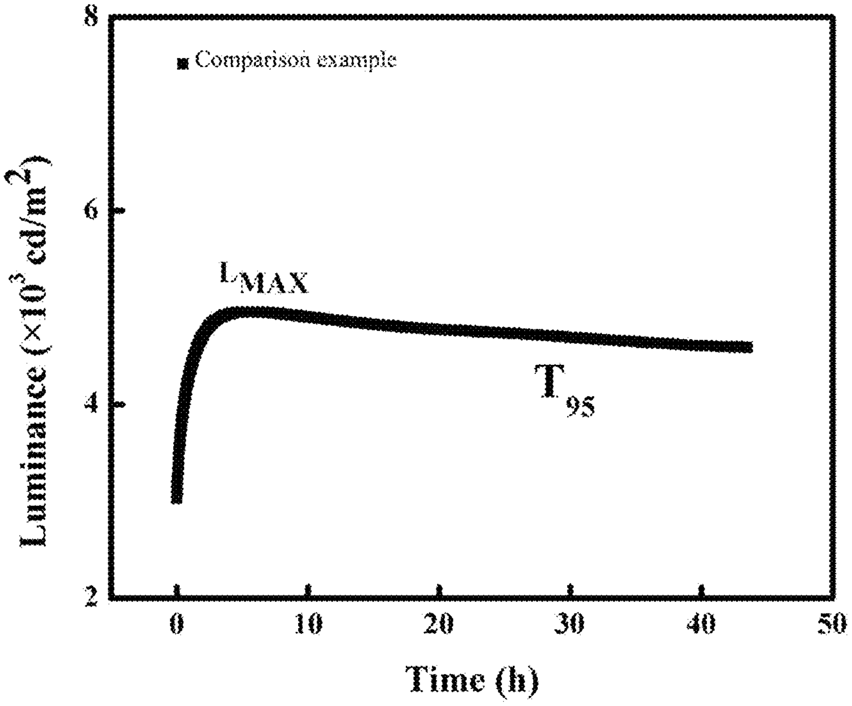
FIG. 9 is a schematic diagram representing a device lifetime provided by an embodiment of the present application.

(E) Extrapolating the lifetimes of device 1000 nit at T95, T80, T75, T50 by empirical formulas, as shown in FIG. 9.

Calculation method: $T_{T95@1000\ nits}=(L_{MAX}/1000)$^A*$T_{95}$

Where $L_{MAX}$ is the highest luminance; A is the acceleration factor; and $T_{95}$ is the time experienced by the device when the highest luminance decays to 95%.

Example 1

Figure 21:
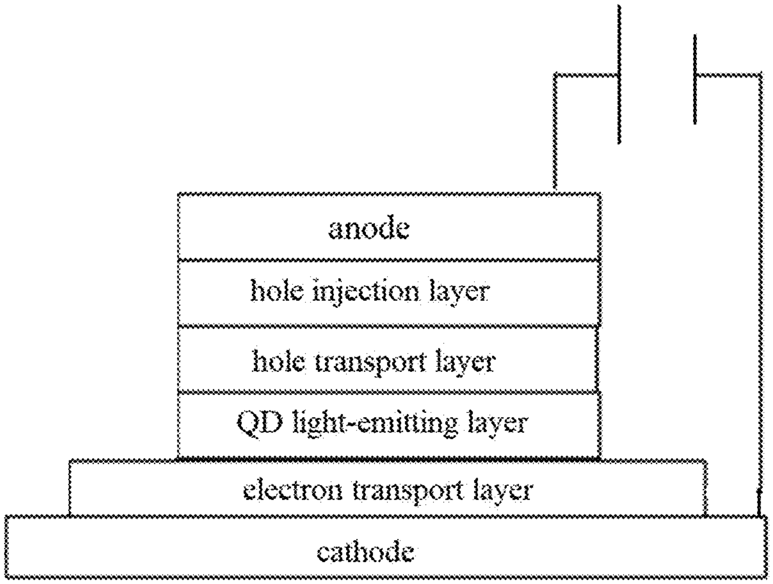
FIG. 21 is a schematic diagram of a quantum dot light-emitting diode provided Example 1 of the present application.

As shown in FIG. 21, a quantum dot light-emitting diode includes an anode substrate and a cathode arranged relative to each other, a quantum dot light-emitting layer arranged between the anode and the cathode, a hole transport layer arranged between the anode and the quantum dot light-emitting layer, a hole injection layer arranged between the anode and the hole transport layer, an electron transport layer arranged between the quantum dot light-emitting layer and the cathode, the anode is an indium tin oxide (ITO) (55 nm), the hole injection layer is PEDOT:PSS (50 nm), the hole transport layer is TFB (30 nm), the quantum dot light-emitting layer is red quantum dot $Cd_xZn_{1-x}Se/ZnSe$ (40 nm), and the electron transport layer is ZnO material (50 nm) prepared by the following method. The cathode is a Ag electrode (100 nm).

The method for preparing the quantum dot light-emitting diode includes:

preparing the hole injection layer, the hole transport layer and the quantum dot light-emitting layer on the anode substrate successively;

preparing the electron transport layer on the quantum dot light-emitting layer;

evaporating or sputtering the top electrode on the electron transport layer made of zinc oxide or the electron transport layer doped with zinc oxide to obtain quantum dot light-emitting diode.

The method for preparing the electron transport layer includes:

Step 1:

(A) dissolving a zinc acetate in a dimethyl sulfoxide at room temperature to form a zinc salt solution with a concentration of 0.6 mol/L, and dissolving a sodium hydroxide in a methanol at room temperature to obtain a lye with a concentration of 0.96 mol/L, and a molar ratio of hydroxide ions to zinc ions is 1.6:1;

(B) adjusting the temperature of the zinc salt solution to 40° C., adding the lye drops into the zinc salt solution according to the molar ratio of the hydroxide ions to the zinc ions being 1.6:1, and stirring the mixed solution continuously at a temperature of 40° C. and reacting for 80 min;

(C) adding a precipitating agent with a volume ratio of 4.5:1 to the mixed solution after the reaction is completed, and a white precipitate being produced in the mixed solution;

(D) after performing cleaning treatment for 3 times onto the precipitate using a reaction solvent methanol, and dissolving the obtained white precipitate to obtain a zinc oxide colloidal solution with a surface hydroxyl content to be 0.3.

Step 2; producing a zinc oxide colloidal solution on the quantum dot light-emitting layer, removing the solvent, and preparing a zinc oxide film with a surface hydroxyl content less than or equal to 0.4.

The hydroxyl in the zinc oxide of the electron transport layer is detected by X-ray photoelectron spectroscopy (XPS). The hydroxyl content in the electron transport layer is determined to be 0.3.

Comparison Example 1

The difference from Example 1 is that the ordinary zinc oxide nano-particles are used as electron transport layer materials. The hydroxyl in the zinc oxide of the electron transport layer is detected by X-ray photoelectron spectroscopy (XPS). The hydroxyl content in the electron transport layer is determined to be 0.5.

Figure 10:
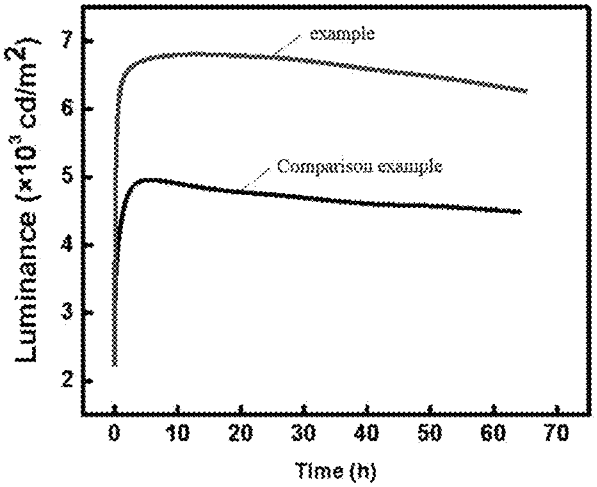
FIG. 10 is a diagram of lifetime test results of a quantum dot light-emitting diode provided by Example 1 of the present application and comparison example 1.

The device lifetime test results of quantum dot light-emitting diode of Embodiments 1 and Comparison example 1 are shown in FIG. 10.

Example 2

A quantum dot light-emitting diode includes an anode substrate and a cathode arranged relative to each other, a quantum dot light-emitting layer arranged between the anode and the cathode, a hole transport layer arranged between the anode and the quantum dot light-emitting layer, a hole injection layer arranged between the anode and the hole transport layer, an electron transport layer arranged between the quantum dot light-emitting layer and the cathode, the anode is an indium tin oxide (ITO) (55 nm), the hole injection layer is PEDOT:PSS (50 nm), the hole transport layer is TFB (30 nm), the quantum dot light-emitting layer is red quantum dot $Cd_xZn_{1-x}Se/ZnSe$ (40 nm), and the electron transport layer is ZnO material prepared by the following method. The cathode is a Ag electrode (100 nm).

The method for preparing the quantum dot light-emitting diode includes:

preparing the hole injection layer, the hole transport layer and the quantum dot light-emitting layer on the anode substrate successively;

preparing the electron transport layer on the quantum dot light-emitting layer;

evaporating or sputtering the top electrode on the electron transport layer made of zinc oxide or the electron transport layer doped with zinc oxide to obtain quantum dot light-emitting diode.

The method for preparing the electron transport layer includes:

(1) (A) dissolving a zinc chloride in a dimethyl sulfoxide at room temperature to form a zinc salt solution with a concentration of 0.8 mol/L, and dissolving an ammonia in a butanol at room temperature to obtain a lye with a concentration of 1.2 mol/L, and a molar ratio of hydroxide ions to zinc ions is 1.5:1; (B) adjusting the temperature of the zinc salt solution to 40° C., adding the lye drops into the zinc salt solution according to the molar ratio of the hydroxide ions to the zinc ions being 1.5:1, and stirring the mixed solution continuously at a temperature of 40° C. and reacting for 60 min; (C) adding a precipitating agent with a volume ratio of 5:1 to the mixed solution after the reaction is completed, and a white precipitate being produced in the mixed solution. After performing cleaning treatment for 3 times onto the precipitate using a reaction solvent butanol, and dissolving the obtained white precipitate to obtain a first zinc oxide colloidal solution with a concentration of 0.6 mol/L.

(2) (A) dissolving a zinc chloride in a dimethyl sulfoxide at room temperature to form a zinc salt solution with a concentration of 0.8 mol/L, and dissolving a potassium hydroxide in an ethanol at room temperature to obtain a lye with a concentration of 1.2 mol/L; (B) adjusting the temperature of the zinc salt solution to 45° C., adding the lye drops into the zinc salt solution according to the molar ratio of the hydroxide ions to the zinc ions being 1.5:1, and stirring the mixed solution continuously at a temperature of 45° C. and reacting for 60 min; (C) adding a precipitating agent with a volume ratio of 5:1 to the mixed solution after the reaction is completed, and a white precipitate being produced in the mixed solution. (D) After performing cleaning treatment for 2 times onto the precipitate using the ethanol, and dissolving the obtained white precipitate to obtain a second zinc oxide colloidal solution with a concentration of 0.6 mol/L.

(3) producing the first zinc oxide colloidal solution on the quantum dot light-emitting layer, removing the solvent, and preparing a first zinc oxide film with a surface hydroxyl content to be 0.3, and a thickness of the first zinc oxide film is 60 nm; producing the second zinc oxide colloidal solution on the first zinc oxide colloidal solution, removing the solvent, and preparing a first zinc oxide film with a surface hydroxyl content to be 0.7, and a thickness of the second zinc oxide film is 20 nm.

The hydroxyl in the zinc oxide of the first electron transport layer and the second electron transport layer is detected by X-ray photoelectron spectroscopy (XPS). The hydroxyl content in the first electron transport layer is determined to be 0.3, and the hydroxyl content in the second electron transport layer is determined to be 0.7.

Figure 11:
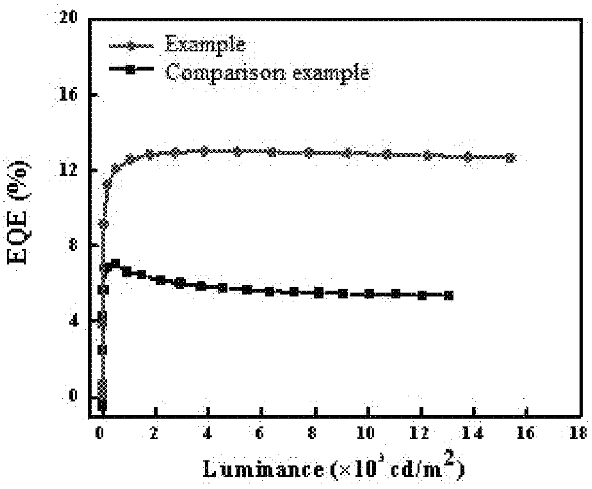
FIG. 11 is a diagram of device EQE test results of a quantum dot light-emitting diode provided by Example 2 of the present application and comparison example 1.
Figure 12:
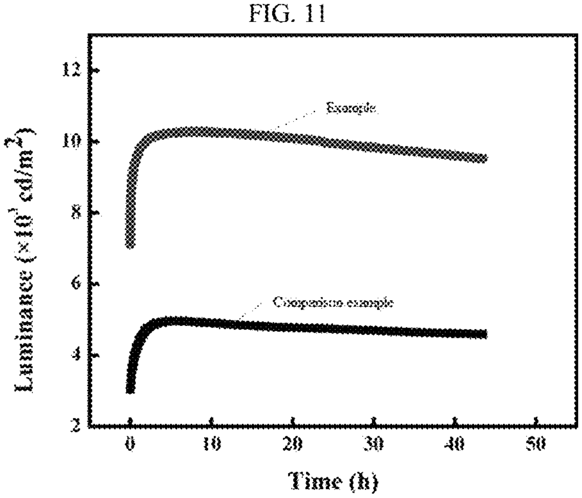
FIG. 12 is a diagram of lifetime test results of a quantum dot light-emitting diode provided by Example 2 of the present application and comparison example 1.

The device EQE test results of quantum dot light-emitting diode of Embodiments 2 and Comparison example 1 are shown in FIG. 11, and the device lifetime test results thereof are shown in FIG. 12.

Example 3

A quantum dot light-emitting diode includes an anode substrate and a cathode arranged relative to each other, a quantum dot light-emitting layer arranged between the anode and the cathode, a hole transport layer arranged between the anode and the quantum dot light-emitting layer, a hole injection layer arranged between the anode and the hole transport layer, an electron transport layer arranged between the quantum dot light-emitting layer and the cathode, the anode is an indium tin oxide (ITO) (55 nm), the hole injection layer is PEDOT:PSS (50 nm), the hole transport layer is TFB (30 nm), the quantum dot light-emitting layer is red quantum dot $Cd_xZn_{1-x}Se/ZnSe$ (40 nm), and the electron transport layer is ZnO material prepared by the following method. The cathode is a Ag electrode (100 nm).

The method for preparing the quantum dot light-emitting diode includes:

preparing the hole injection layer, the hole transport layer and the quantum dot light-emitting layer on the anode substrate successively;

preparing the electron transport layer on the quantum dot light-emitting layer;

evaporating or sputtering the top electrode on the electron transport layer made of zinc oxide or the electron transport layer doped with zinc oxide to obtain quantum dot light-emitting diode.

The method for preparing the electron transport layer includes:

(1) (A) dissolving a zinc acetate in a dimethyl sulfoxide at room temperature to form a zinc salt solution with a concentration of 0.5 mol/L, and dissolving sodium hydroxide in methanol at room temperature to obtain a lye with a concentration of 0.85 mol/L, and a molar ratio of hydroxide ions to zinc ions is 1.7:1;

(B) adjusting the temperature of the zinc salt solution to 60° C., adding the lye drops into the zinc salt solution according to the molar ratio of the hydroxide ions to the zinc ions being 1.7:1, and stirring the mixed solution continuously at a temperature of 60° C. and reacting for 90 min;

(C) adding a precipitating agent with a volume ratio of 3:1 to the mixed solution after the reaction is completed, and a white precipitate being produced in the mixed solution;

(D) dissolving the obtained white precipitate, adding a hydrochloric acid of 0.05 mol/L to the zinc oxide colloidal solution, adjusting the pH value of the solution to 7.2, and obtaining a first zinc oxide colloidal solution with a hydroxyl content to be 0.25.

(2) (A) dissolving a zinc acetate in a dimethyl sulfoxide at room temperature to form a zinc salt solution with a concentration of 0.5 mol/L, and dissolving sodium hydroxide in methanol at room temperature to obtain a lye with a concentration of 0.85 mol/L, and a molar ratio of hydroxide ions to zinc ions is 1.7:1;

(B) adjusting the temperature of the zinc salt solution to 60° C., adding the lye drops into the zinc salt solution according to the molar ratio of the hydroxide ions to the zinc ions being 1.7:1, and stirring the mixed solution continuously at a temperature of 60° C. and reacting for 90 min;

(C) adding a precipitating agent with a volume ratio of 3:1 to the mixed solution after the reaction is completed, and a white precipitate being produced in the mixed solution;

(D) dissolving the obtained white precipitate, adding a hydrochloric acid of 0.1 mol/L to the zinc oxide colloidal solution, adjusting the pH value of the solution to 8, and obtaining a second zinc oxide colloidal solution with a hydroxyl content to be 0.85.

(3) producing the second zinc oxide colloidal solution on the quantum dot light-emitting layer, removing the solvent, and preparing a second zinc oxide film with a surface hydroxyl content to be 0.85; producing the first zinc oxide colloidal solution on the second zinc oxide film, removing the solvent, and preparing a first zinc oxide film with a surface hydroxyl content to be 0.25. The thickness of the first zinc oxide film is 60 nm and the thickness of the second zinc oxide film is 30 nm.

The hydroxyl in the zinc oxide of the first electron transport layer and the second electron transport layer is detected by X-ray photoelectron spectroscopy (XPS). The hydroxyl content in the first electron transport layer is determined to be 0.25, and the hydroxyl content in the second electron transport layer is determined to be 0.85.

Figure 13:
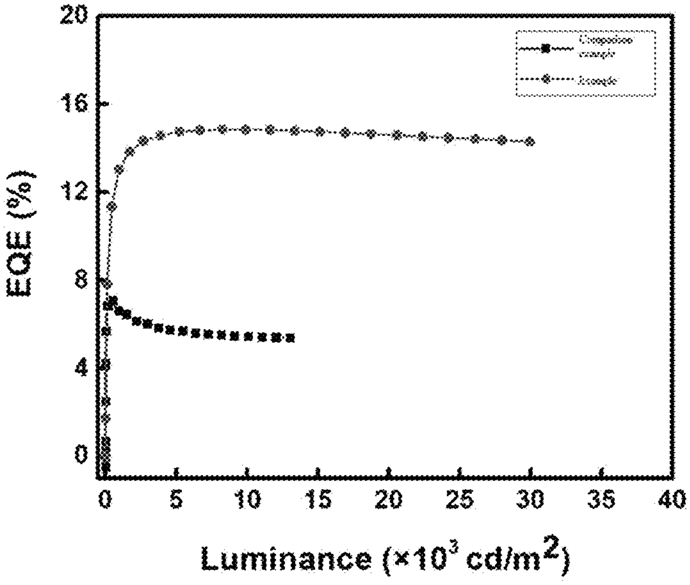
FIG. 13 is a diagram of device EQE test results of a quantum dot light-emitting diode provided by Example 3 of the present application and comparison example 1.
Figure 14:
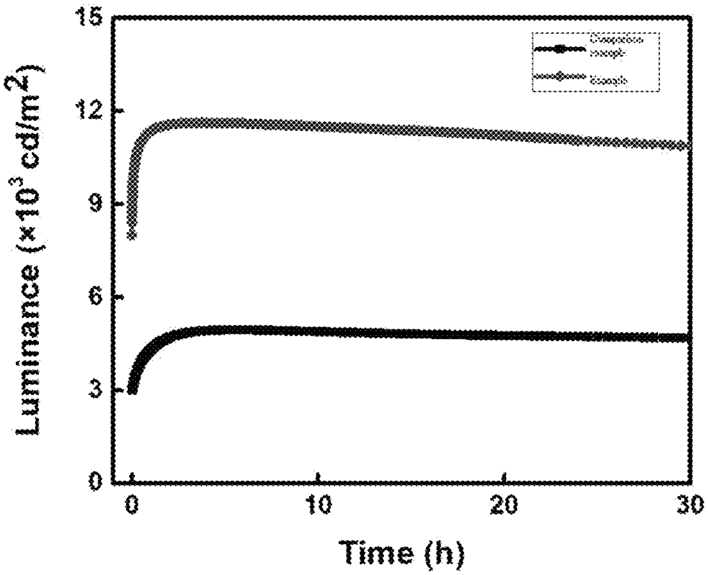
FIG. 14 is a diagram of lifetime test results of a quantum dot light-emitting diode provided by Example 3 of the present application and comparison example 1.

The device EQE test results of quantum dot light-emitting diode of Embodiments 3 and Comparison example 1 are shown in FIG. 13, and the device lifetime test results thereof are shown in FIG. 14.

Example 4

A quantum dot light-emitting diode includes an anode substrate and a cathode arranged relative to each other, a quantum dot light-emitting layer arranged between the anode and the cathode, a hole transport layer arranged between the anode and the quantum dot light-emitting layer, a hole injection layer arranged between the anode and the hole transport layer, an electron transport layer arranged between the quantum dot light-emitting layer and the cathode, the anode is an indium tin oxide (ITO) (55 nm), the hole injection layer is PEDOT:PSS (50 nm), the hole transport layer is TFB (30 nm), the quantum dot light-emitting layer is red quantum dot $Cd_xZn_{1-x}Se/ZnSe$ (40 nm), and the electron transport layer is ZnO material prepared by the following method. The cathode is a Ag electrode (100 nm).

The method for preparing the quantum dot light-emitting diode includes:

preparing the hole injection layer, the hole transport layer and the quantum dot light-emitting layer on the anode substrate successively;

preparing the electron transport layer on the quantum dot light-emitting layer;

evaporating or sputtering the top electrode on the electron transport layer made of zinc oxide or the electron transport layer doped with zinc oxide to obtain quantum dot light-emitting diode.

The method for preparing the electron transport layer includes:

(A) dissolving a zinc acetate in a butanol at room temperature to form a zinc salt solution with a concentration of 0.5 mol/L, and dissolving a TMAH in a butanol at room temperature to obtain a lye with a concentration of 1 mol/L, and a molar ratio of hydroxide ions to zinc ions is 2:1;

(B) adjusting the temperature of the zinc salt solution to 50° C., adding the lye drops into the zinc salt solution according to the molar ratio of the hydroxide ions to the zinc ions being 2:1, and stirring the mixed solution continuously at a temperature of 50° C. and reacting for 70 min;

(C) adding a precipitating agent with a volume ratio of 3:1 to the mixed solution after the reaction is completed, and a white precipitate being produced in the mixed solution. After performing cleaning treatment for 3 times onto the precipitate using a reaction solvent butanol, and dissolving the obtained white precipitate to obtain a first zinc oxide colloidal solution with a concentration of 0.5 mol/L.

(2) (A) dissolving a magnesium acetate and a zinc acetate in a butanol at room temperature to form a mixed salt solution with a concentration of 0.5 mol/L, in which the molar ratio of magnesium ions is 5%, and dissolving a potassium hydroxide in an ethanol at room temperature to obtain a lye with a concentration of 1 mol/L;

adjusting the temperature of the zinc salt solution to 40° C., adding the lye drops into the mixed salt solution according to the molar ratio of the hydroxide ions to the zinc ions being 2:1, and stirring the mixed solution continuously at a temperature of 40° C. and reacting for 90 min; (B) adding a precipitating agent with a volume ratio of 5:1 to the mixed solution after the reaction is completed, and a white precipitate being produced in the mixed solution; (C) after performing cleaning treatment for 2 times onto the precipitate using the butanol, and dissolving the obtained white precipitate to obtain a second 5% magnesium-doped zinc oxide colloidal solution with a concentration of 0.5 mol/L.

(3) producing the first zinc oxide colloidal solution on the quantum dot light-emitting layer, removing the solvent, and preparing a zinc oxide prefabricated film; depositing a hydrochloric acid of 0.1 mmol/L on the surface of the prefabricated zinc oxide film, the deposited amount of the acid solution and the weight of the lower layer of the prefabricated zinc oxide film are satisfied as follows: every 5 mg zinc oxide prefabricated film is treated with the acid solution of 80 μL; and reacting for 60 min at a temperature of 70° C., removing the solvent, and preparing a first zinc oxide film with a surface hydroxyl content to be 0.3; depositing the second 5% magnesium-doped zinc oxide colloidal solution on the first zinc oxide film, removing the solvent, and preparing a second 5% magnesium-doped zinc oxide film with a surface hydroxyl content to be 0.5.

The thickness of the first zinc oxide film is 60 nm, and the thickness of the second 5% magnesium-doped zinc oxide film is 30 nm.

The hydroxyl in the zinc oxide of the first electron transport layer and the second electron transport layer is detected by X-ray photoelectron spectroscopy (XPS). The hydroxyl content in the first electron transport layer is determined to be 0.3, and the hydroxyl content in the second electron transport layer is determined to be 0.5.

Figure 15:
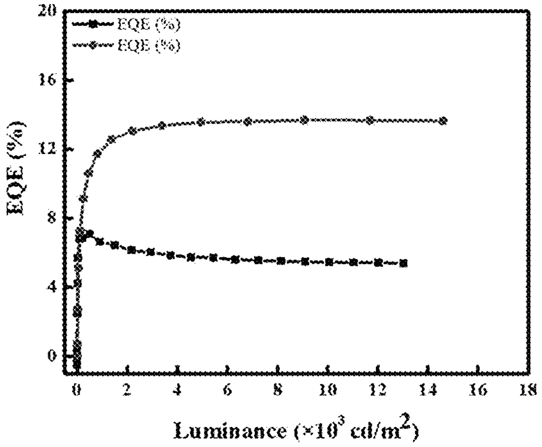
FIG. 15 is a diagram of device EQE test results of a quantum dot light-emitting diode provided by Example 4 of the present application and comparison example 1.
Figure 16:
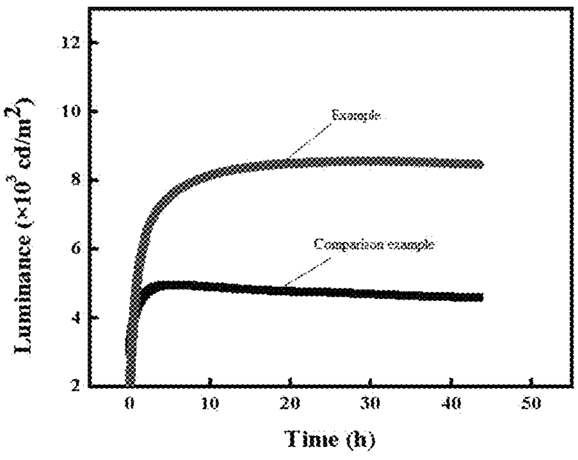
FIG. 16 is a diagram of lifetime test results of a quantum dot light-emitting diode provided by Example 4 of the present application and comparison example 1.

The device EQE test results of quantum dot light-emitting diode of Embodiments 4 and Comparison example 1 are shown in FIG. 15, and the device lifetime test results thereof are shown in FIG. 16.

Example 5

A quantum dot light-emitting diode includes an anode substrate and a cathode arranged relative to each other, a quantum dot light-emitting layer arranged between the anode and the cathode, a hole transport layer arranged between the anode and the quantum dot light-emitting layer, a hole injection layer arranged between the anode and the hole transport layer, an electron transport layer arranged between the quantum dot light-emitting layer and the cathode, the anode is an indium tin oxide (ITO) (55 nm), the hole injection layer is PEDOT:PSS (50 nm), the hole transport layer is TFB (30 nm), the quantum dot light-emitting layer is red quantum dot $Cd_xZn_{1-x}Se/ZnSe$ (40 nm), and the electron transport layer is ZnO material prepared by the following method. The cathode is a Ag electrode (100 nm).

The method for preparing the quantum dot light-emitting diode includes:

preparing the hole injection layer, the hole transport layer and the quantum dot light-emitting layer on the anode substrate successively;

preparing the electron transport layer on the quantum dot light-emitting layer;

evaporating or sputtering the top electrode on the electron transport layer made of zinc oxide or the electron transport layer doped with zinc oxide to obtain quantum dot light-emitting diode.

The method for preparing the electron transport layer includes:

(1) (A) dissolving a zinc acetate in a butanol at room temperature to form a zinc salt solution with a concentration of 1 mol/L, and dissolving a sodium hydroxide in an ethanol at room temperature to obtain a lye with a concentration of 1.5 mol/L, and a molar ratio of hydroxide ions to zinc ions is 1.5:1;

(B) adjusting the temperature of the zinc salt solution to 60° C., adding the lye drops into the zinc salt solution according to the molar ratio of the hydroxide ions to the zinc ions being 1.5:1, and stirring the mixed solution continuously at a temperature of 60° C. and reacting for 60 min;

(C) adding a precipitating agent with a volume ratio of 4:1 to the mixed solution after the reaction is completed, and a white precipitate being produced in the mixed solution. After performing cleaning treatment for 2 times onto the precipitate using a reaction solvent ethanol, and dissolving the obtained white precipitate to obtain a first zinc oxide colloidal solution with a concentration of 0.75 mol/L.

(2) dissolving a yttrium sulfate and a zinc sulfate in a butanol at room temperature to form a mixed salt solution with a concentration of 1 mol/L, in which the molar radio of yttrium ions is 10%, and dissolving a potassium hydroxide in an ethanol at room temperature to obtain a lye with a concentration of 2 mol/L; adjusting the temperature of the zinc salt solution to 50° C., adding the lye drops into the zinc salt solution according to the molar ratio of the hydroxide ions to the zinc ions being 2:1, and stirring the mixed solution continuously at a temperature of 50° C. and reacting for 90 min; adding a precipitating agent with a volume ratio of 4:1 to the mixed solution after the reaction is completed, and a white precipitate being produced in the mixed solution; after performing cleaning treatment for 2 times onto the precipitate using the ethanol, and dissolving the obtained white precipitate to obtain a second 10% yttrium-doped zinc oxide colloidal solution with a concentration of 0.75 mol/L.

(3) producing the first zinc oxide colloidal solution on the quantum dot light-emitting layer, removing the solvent, and preparing a zinc oxide prefabricated film; depositing a nitric acid of 0.075 mmol/L on the surface of the prefabricated zinc oxide film, the deposited amount of the acid solution and the weight of the lower layer of the prefabricated zinc oxide film are satisfied as follows: every 5 mg zinc oxide prefabricated film is treated with the acid solution of 100 μL; and reacting for 90 min at a temperature of 80° C., removing the solvent, and preparing a first zinc oxide film with a surface hydroxyl content to be 0.35; depositing the second 10% yttrium-doped zinc oxide colloidal solution on the first zinc oxide film, removing the solvent, and preparing a second 10% yttrium-dope zinc oxide film with a surface hydroxyl content to be 0.75.

The thickness of the first zinc oxide film is 70 nm, and the thickness of the second 10% yttrium-dope zinc oxide film is 15 nm.

Figure 17:
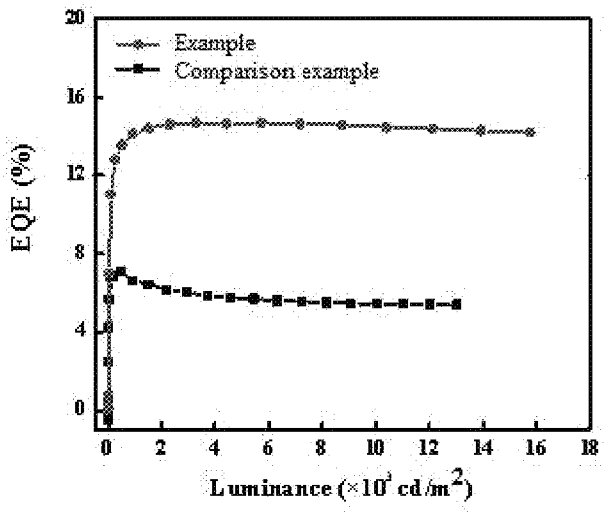
FIG. 17 is a diagram of device EQE test results of a quantum dot light-emitting diode provided by Example 5 of the present application and comparison example 1.
Figure 18:
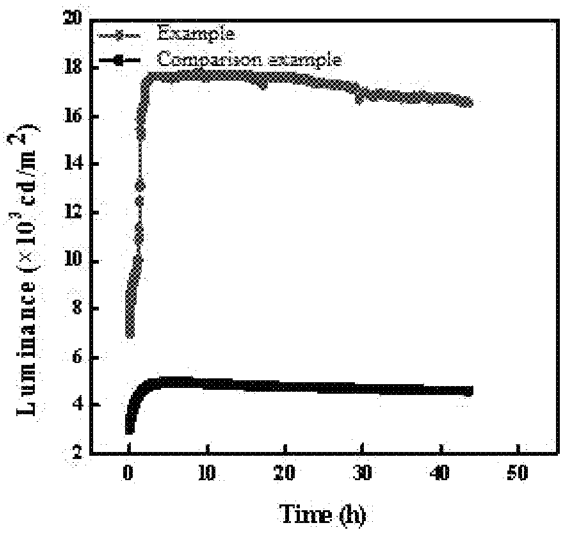
FIG. 18 is a diagram of lifetime test results of a quantum dot light-emitting diode provided by Example 5 of the present application and comparison example 1.

The hydroxyl in the zinc oxide of the first electron transport layer, the second electron transport layer and the third electron transport layer is detected by X-ray photoelectron spectroscopy (XPS). The hydroxyl content in the first electron transport layer is determined to be the hydroxyl content in the second electron transport layer is determined to be 0.35, and the hydroxyl content in the third electron transport layer is determined to be 0.75. The device EQE test results of quantum dot light-emitting diode of Embodiments 5 and Comparison example 1 are shown in FIG. 17, and the device lifetime test results thereof are shown in FIG. 18.

Example 6

A quantum dot light-emitting diode includes an anode substrate and a cathode arranged relative to each other, a quantum dot light-emitting layer arranged between the anode and the cathode, a hole transport layer arranged between the anode and the quantum dot light-emitting layer, a hole injection layer arranged between the anode and the hole transport layer, an electron transport layer arranged between the quantum dot light-emitting layer and the cathode, the anode is an indium tin oxide (ITO) (55 nm), the hole injection layer is PEDOT:PSS (50 nm), the hole transport layer is TFB (30 nm), the quantum dot light-emitting layer is red quantum dot $Cd_xZn_{1-x}Se/ZnSe$ (40 nm), and the electron transport layer is ZnO material prepared by the following method. The cathode is a Ag electrode (100 nm).

The method for preparing the quantum dot light-emitting diode includes:

preparing the hole injection layer, the hole transport layer and the quantum dot light-emitting layer on the anode substrate successively;

preparing the electron transport layer on the quantum dot light-emitting layer;

evaporating or sputtering the top electrode on the electron transport layer made of zinc oxide or the electron transport layer doped with zinc oxide to obtain quantum dot light-emitting diode.

The method for preparing the electron transport layer includes:

(1) (A) dissolving a zinc acetate in a dimethyl sulfoxide at room temperature to form a zinc salt solution with a concentration of 0.5 mol/L, and dissolving a sodium hydroxide in a methanol at room temperature to obtain a lye with a concentration of 0.85 mol/L, and a molar ratio of hydroxide ions to zinc ions is 1.7:1;

(B) adjusting the temperature of the zinc salt solution to 60° C., adding the lye drops into the zinc salt solution according to the molar ratio of the hydroxide ions to the zinc ions being 1.7:1, and stirring the mixed solution continuously at a temperature of 60° C. and reacting for 90 min;

(C) adding a precipitating agent with a volume ratio of 4:1 to the mixed solution after the reaction is completed, and a white precipitate being produced in the mixed solution. After performing cleaning treatment for 3 times onto the precipitate using a reaction solvent methanol, and dissolving the obtained white precipitate to obtain a zinc oxide colloidal solution with a surface hydroxyl content to be 0.15.

(2) (A) dissolving a zinc acetate in a dimethyl sulfoxide at room temperature to form a zinc salt solution with a concentration of 0.5 mol/L, and dissolving a sodium hydroxide in a methanol at room temperature to obtain a lye with a concentration of 0.85 mol/L, and a molar ratio of hydroxide ions to zinc ions is 1.9:1;

(B) adjusting the temperature of the zinc salt solution to 60° C., adding the lye drops into the zinc salt solution according to the molar ratio of the hydroxide ions to the zinc ions being 1.7:1, and stirring the mixed solution continuously at a temperature of 60° C. and reacting for 90 min;

(C) adding a precipitating agent with a volume ratio of 3:1 to the mixed solution after the reaction is completed, and a white precipitate being produced in the mixed solution;

(D) dissolving the obtained white precipitate, adding a TMAH with molar concentration of 0.3 mol/L to the zinc oxide colloidal solution, adjusting the pH value of the solution to be 8, and obtaining a second zinc oxide colloidal solution with a hydroxyl content to be 0.70.

(3) (A) dissolving a zinc acetate in a dimethyl sulfoxide at room temperature to form a zinc salt solution with a concentration of 0.5 mol/L, and dissolving a sodium hydroxide in a methanol at room temperature to obtain a lye with a concentration of 0.85 mol/L, and a molar ratio of hydroxide ions to zinc ions is 1.9:1;

(B) adjusting the temperature of the zinc salt solution to 60° C., adding the lye drops into the zinc salt solution according to the molar ratio of the hydroxide ions to the zinc ions being 1.7:1, and stirring the mixed solution continuously at a temperature of 60° C. and reacting for 90 min;

(C) adding a precipitating agent with a volume ratio of 4:1 to the mixed solution after the reaction is completed, and a white precipitate being produced in the mixed solution;

(D) dissolving the obtained white precipitate, adding a sulfuric acid of 0.1 mol/L to the zinc oxide colloidal solution, adjusting the pH value of the solution to be 7.5, and obtaining a third zinc oxide colloidal solution with a hydroxyl content to be 0.35.

(4) producing the first zinc oxide colloidal solution on the quantum dot light-emitting layer, removing the solvent, and preparing a first zinc oxide film with a surface hydroxyl content to be producing the second zinc oxide colloidal solution on the first zinc oxide film, removing the solvent, and preparing a second zinc oxide film with a surface hydroxyl content to be 0.7; producing the third zinc oxide colloidal solution on the second zinc oxide film, removing the solvent, and preparing a third zinc oxide film with a surface hydroxyl content to be 0.35. The thickness of the first zinc oxide film is 60 nm, the thickness of the second zinc oxide film is 30 nm, and the thickness of the third zinc oxide film is 60 nm.

The hydroxyl in the zinc oxide colloidal solution or the zinc oxide solution of the first electron transport layer, the second electron transport layer and the third electron transport layer is detected by X-ray photoelectron spectroscopy (XPS). The hydroxyl content in the first electron transport layer is determined to be 0.15, the hydroxyl content in the second electron transport layer is determined to be 0.7, and the hydroxyl content in the third electron transport layer is determined to be 0.35.

Figure 19:
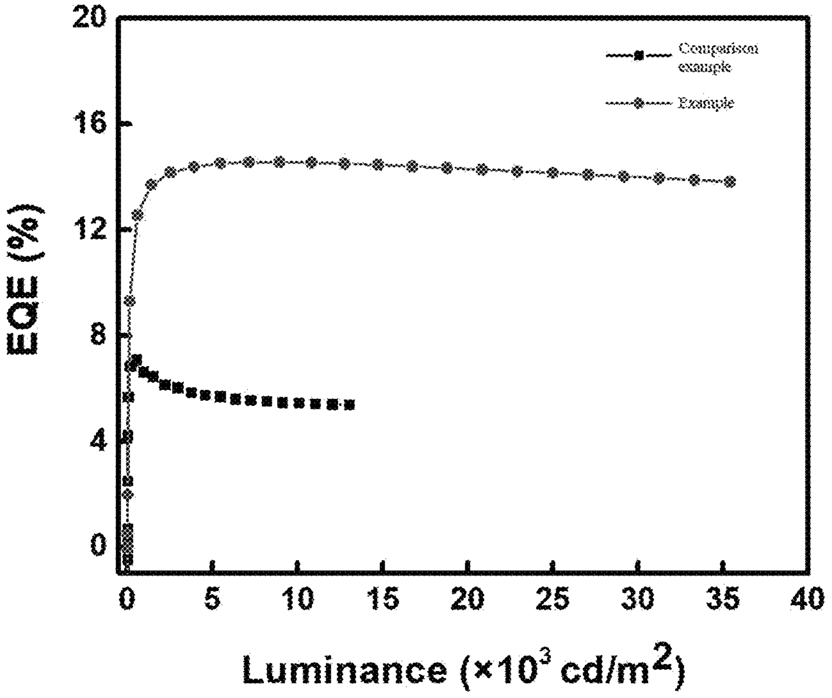
FIG. 19 is a diagram of device EQE test results of a quantum dot light-emitting diode provided by Example 6 of the present application and comparison example 1.
Figure 20:
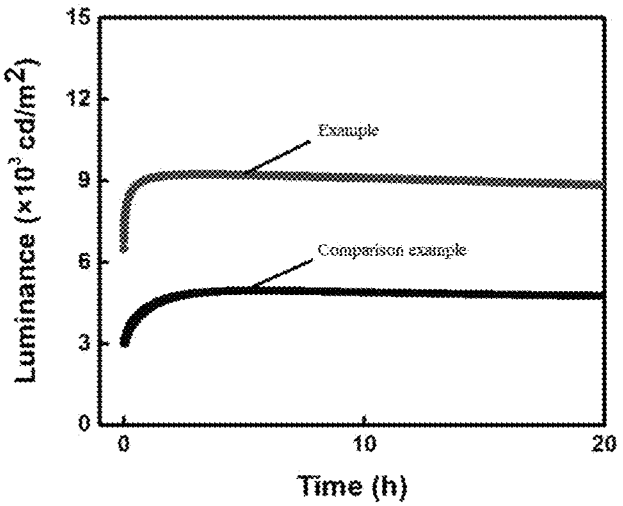
FIG. 20 is a diagram of lifetime test results of a quantum dot light-emitting diode provided by Example 6 of the present application and comparison example 1.

The device EQE test results of quantum dot light-emitting diode of Embodiments 6 and Comparison example 1 are shown in FIG. 19, and the device lifetime test results thereof are shown in FIG. 20.

The performance tests of the quantum dot light-emitting diode provided by the six Examples and the Comparison example are carried out, and the test results are shown in Table 1 below:

TABLE 1

| sample | EQE (%) | Lifetime T95@1000 nit (h) | $R_{OH} = \frac{A_{OH}}{A_{MO}}$ |
|---|---|---|---|
| Example 1 | | 1403.27 | 0.3 |
| Comparison example 1 | 7.09 | 237 | 0.5 |
| Example 2 | 12.65 | 2229.78 | |
| Example 3 | 16.46 | 1487 | |
| Example 4 | 13.69 | 2590.08 | |
| Example 5 | 14.4 | 2233.85 | |
| Example 6 | 15.39 | 1250 | |

As can be seen from Table 1, compared with Example 1 and Comparison example 1, the present application enhances the device lifetime of a quantum dot light-emitting diode by regulating the surface hydroxyl content in the electron transport layer material zinc oxide to be less than or equal to 0.4. This is attributed to: By using a zinc oxide film with a surface hydroxyl content less than or equal to 0.4 as the electron transport layer, the transmission of electrons to the quantum dot light-emitting layer becomes smooth, and the amount of electrons injected into the quantum dot light-emitting layer increases, so that the injection rate of electrons into the quantum dot light-emitting layer is higher than that of holes into the quantum dot light-emitting layer, which will cause the quantum dots in the quantum dot light-emitting layer to be negatively charged. This negatively charged state can be maintained due to the core-shell structure of quantum dots and the binding effect of electrically inert surface ligands, while the coulomb repulsion effect makes further injection of electrons into the quantum dot light-emitting layer more and more difficult. When the quantum dot light-emitting diode device continues to light up and work to a stable state, the negatively charged state of the quantum dot also tends to be stable, that is, the electrons newly trapped and bound by the quantum dot reach a dynamic balance with the electrons consumed by the radiation transition, and the injection rate of electrons into the quantum dot light-emitting layer is much lower than that in the initial stage. At this time, the lower electron injection rate and hole injection rate just reach the carrier injection balance, so that the device lifetime is improved. In other words, although at the initial stage of the work of the quantum dot light-emitting diode device, the higher electron injection rate will cause the quantum dot light-emitting diode device to be in the unbalanced state of carrier injection, which will affect the device performance. However, when the quantum dot light-emitting diode device continues to light up and work to a stable state, the reduced electron injection rate will form a carrier injection balance with the hole injection rate, and the device efficiency will be maintained continuously, thus the lifetime of the quantum dot light-emitting diode device is effectively improved.

Compared the embodiments 2-6 with Comparison example 1, the device lifetime and EQE of the quantum dot light-emitting diode provided in the present application are improved. This is attributed to: The quantum dot light-emitting diode provided in the embodiments of the present application is provided with a zinc oxide film with a surface hydroxyl content less than or equal to 0.4 and a zinc oxide film with a surface hydroxyl content greater than or equal to 0.6 that constitute a laminated layer as an electron transport layer; the lifetime of the quantum dot light-emitting diode can be improved through the zinc oxide film with a surface hydroxyl content less than or equal to 0.4, and the EQE of the device can be improved by the zinc oxide film with a surface hydroxyl content greater than or equal to 0.6, and finally achieve better comprehensive performance. The reason why the EQE of the device is improved by the zinc oxide film with a surface hydroxyl content greater than or equal to 0.6 is that the zinc oxide with a surface hydroxyl content greater than or equal to 0.6 is used as an electron transport layer material, which can inhibit the transmission of electrons in the electron transport layer and reduce the transmission of electrons in the quantum dot light-emitting diode, therefore, the injection of electrons in the quantum dot light-emitting layer is reduced, so as to achieve the carrier injection balance in the quantum dot light-emitting diode. Finally, a higher external quantum efficiency is given in the initial operating state of the device.

The above is only a better embodiment of the present application and is not intended to limit the present application. Any modification, equivalent replacement, improvement, etc. made within the spirit and principles of the present application shall be within the present application.

What is claimed is:

1. A method for regulating an electron mobility of a zinc oxide, comprising following steps:

preparing the zinc oxide, wherein the electron mobility of the zinc oxide is regulated by controlling a surface hydroxyl content of the zinc oxide during the preparation of the zinc oxide;

wherein the surface hydroxyl content represents a ratio of a hydroxyl oxygen peak area to a lattice oxygen peak area in an XPS spectrum;

wherein the surface hydroxyl content of the zinc oxide is controlled to be greater than or equal to 0.6 during the preparation of the zinc oxide; and wherein the zinc oxide is zinc oxide nano-particles and a method of controlling the surface hydroxyl content of the zinc oxide comprises:

collecting a precipitate after mixing a zinc salt solution with a first lye; and dissolving the precipitate after being cleaning treatment to obtain a zinc oxide colloidal solution; and adding a second lye to the zinc oxide colloidal solution, adjusting a pH value of the zinc oxide colloidal solution to be greater than or equal to 8, and preparing the zinc oxide nano-particles with the surface hydroxyl content greater than or equal to 0.6.

2. The method for regulating the electron mobility of the zinc oxide according to claim 1, wherein the zinc oxide is zinc oxide nano-particles and the method of controlling the surface hydroxyl content of the zinc oxide comprises:

collecting a precipitate after mixing a zinc salt solution with a first lye; and performing a cleaning treatment twice or less to the precipitate using a reaction solvent, to obtain the zinc oxide nano-particles with the surface hydroxyl content greater than or equal to 0.6.

3. The method for regulating the electron mobility of the zinc oxide according to claim 2, wherein an alkali of the first lye is selected from an alkali having $K_b>10^{-1}$, and a number of the cleaning treatment is less than or equal to 2 times; or alternatively an alkali of the first lye is selected from an alkali having $K_b<10^{-1}$, and a number of the cleaning treatment is less than or equal to one time.

4. The method for regulating the electron mobility of the zinc oxide according to claim 1, wherein the zinc oxide is a zinc oxide film, and the method of controlling the surface hydroxyl content of the zinc oxide comprises:

preparing a zinc oxide prefabricated film on a substrate; and performing a drying treatment after depositing a second lye on a surface of the zinc oxide prefabricated film, to obtain the zinc oxide film with the surface hydroxyl content greater than or equal to 0.6.

5. The method for regulating the electron mobility of the zinc oxide according to claim 4, wherein a concentration of the second lye is ranged from 0.05 mmol/L to 0.5 mmol/L.

6. The method for regulating the electron mobility of the zinc oxide according to claim 5, wherein an alkali of the second lye is an inorganic alkali, and the concentration of the second lye is ranged from 0.05 mmol/L to 0.1 mmol/L.

7. The method for regulating the electron mobility of the zinc oxide according to claim 6, wherein in the step of after depositing the second lye on the surface of the zinc oxide prefabricated film, an addition amount of the second lye is satisfied as follows: every 5 mg zinc oxide prefabricated film is treated with the second lye of 50 μL-400 μL.

8. The method for regulating the electron mobility of the zinc oxide according to claim 4, wherein a temperature of the drying treatment is ranged from 10° C. to 100° C. and a drying duration is ranged from 10 minutes to 2 hours.

9. The method for regulating the electron mobility of the zinc oxide according to claim 1, wherein the zinc oxide is doped zinc oxide nano-particles or undoped zinc oxide nano-particles, and doped ions of the doped zinc oxide nano-particles are at least one selected from a group of $Mg^{2+}$, $Mn^{2+}$, $Al^{3+}$, $Y^{3+}$, $La^{3+}$, $Li^{+}$, $Gd^{3+}$, $Zr^{4+}$, and $Ce^{4+}$.

10. A quantum dot light-emitting diode, comprising an electron transport layer, wherein the electron transport layer is made of zinc oxide, and an electron mobility of the zinc oxide is regulated by controlling a surface hydroxyl content of the zinc oxide during a preparation of the zinc oxide;

wherein the surface hydroxyl content represents a ratio of a hydroxyl oxygen peak area to a lattice oxygen peak area in an XPS spectrum;

wherein the surface hydroxyl content of the zinc oxide is controlled to be greater than or equal to 0.6 during the preparation of the zinc oxide; and wherein the zinc oxide is zinc oxide nano-particles and a method of controlling the surface hydroxyl content of the zinc oxide comprises:

collecting a precipitate after mixing a zinc salt solution with a first lye; and dissolving the precipitate after being cleaning treatment to obtain a zinc oxide colloidal solution; and adding a second lye to the zinc oxide colloidal solution, adjusting a pH value of the zinc oxide colloidal solution to be greater than or equal to 8, and preparing the zinc oxide nano-particles with the surface hydroxyl content greater than or equal to 0.6.

11. The method for regulating the electron mobility of the zinc oxide according to claim 1, wherein the surface hydroxyl content of the zinc oxide is controlled to be less than or equal to 0.4 during the preparation of the zinc oxide.

12. The method for regulating the electron mobility of the zinc oxide according to claim 11, wherein the zinc oxide is zinc oxide nano-particles and a method of controlling the surface hydroxyl content of the zinc oxide comprises:

collecting a precipitate after mixing a zinc salt solution with a first lye; and performing a cleaning treatment twice or more to the precipitate using a reaction solvent, to obtain the zinc oxide nano-particles with the surface hydroxyl content less than or equal to 0.4.

13. The method for regulating the electron mobility of the zinc oxide according to claim 12, wherein an alkali of the first lye is selected from an alkali having $K_b>10^{-1}$, and a number of the cleaning treatment is greater than or equal to 3 times; or alternatively an alkali of the first lye is selected from an alkali having $K_b<10^{-1}$, and a number of the cleaning treatment is greater than or equal to 2 times.

14. The method for regulating the electron mobility of the zinc oxide according to claim 11, wherein the zinc oxide is zinc oxide nano-particles and the method of controlling the surface hydroxyl content of the zinc oxide comprises:

collecting a precipitate after mixing a zinc salt solution with a first lye; dissolving the precipitate after being cleaning treatment to obtain a zinc oxide colloidal solution; and adding an acid solution to the zinc oxide colloidal solution, adjusting a pH value of the zinc oxide colloidal solution to be ranged from 7 to 8, and preparing the zinc oxide nano-particles with the surface hydroxyl content less than or equal to 0.4.

15. The method for regulating the electron mobility of the zinc oxide according to claim 1, wherein the zinc oxide is a zinc oxide film, and the method of controlling the surface hydroxyl content of the zinc oxide comprises:

preparing a zinc oxide prefabricated film on a substrate; and performing a drying treatment after depositing an acid solution on a surface of the zinc oxide prefabricated film, to obtain the zinc oxide film with the surface hydroxyl content less than or equal to 0.4.

16. The method for regulating the electron mobility of the zinc oxide according to claim 15, wherein a concentration of the acid solution is ranged from 0.05 mmol/L to 0.5 mmol/L; and in the step of after depositing the acid solution on the surface of the zinc oxide prefabricated film, an addition amount of the acid solution is satisfied as follows: every 5 mg zinc oxide prefabricated film is treated with the acid solution of 50 μL-1000 μL.

17. The method for regulating the electron mobility of the zinc oxide according to claim 16, wherein an acid in the acid solution is an inorganic acid, and the concentration of the acid solution is ranged from 0.05 mmol/L to 0.1 mmol/L; and in the step of after depositing the acid solution on the surface of the zinc oxide prefabricated film, an addition amount of the acid solution is satisfied as follows: every 5 mg zinc oxide prefabricated film is treated with the acid solution of 50 μL-200μ.

18. The method for regulating the electron mobility of the zinc oxide according to claim 16, wherein an acid in the acid solution is an organic carboxylic acid, and the concentration of the acid solution is ranged from 0.2 mmol/L to 0.4 mmol/L; and in the step of after depositing the acid solution on the surface of the zinc oxide prefabricated film, an addition amount of the acid solution is satisfied as follows: every 5 mg zinc oxide prefabricated film is treated with the acid solution of 100 μL-500 μL.

* * * * *